(12) United States Patent
Hisatake et al.

(10) Patent No.: US 10,761,126 B2
(45) Date of Patent: Sep. 1, 2020

(54) ELECTRO-OPTIC PROBE, ELECTROMAGNETIC WAVE MEASURING APPARATUS, AND ELECTROMAGNETIC WAVE MEASURING METHOD

(71) Applicant: OSAKA UNIVERSITY, Osaka (JP)

(72) Inventors: Shintarou Hisatake, Osaka (JP); Tadao Nagatsuma, Osaka (JP); Hirohisa Uchida, Kyoto (JP)

(73) Assignee: Osaka University, Osaka (JP)

( * ) Notice: Subject to any disclaimer, the term of this patent is extended or adjusted under 35 U.S.C. 154(b) by 0 days.

(21) Appl. No.: 15/740,225

(22) PCT Filed: Jun. 28, 2016

(86) PCT No.: PCT/JP2016/069076
§ 371 (c)(1),
(2) Date: Dec. 27, 2017

(87) PCT Pub. No.: WO2017/002782
PCT Pub. Date: Jan. 5, 2017

(65) Prior Publication Data
US 2018/0188305 A1 Jul. 5, 2018

(30) Foreign Application Priority Data
Jun. 29, 2015 (JP) .................. 2015-130280

(51) Int. Cl.
*G01R 29/08* (2006.01)
(52) U.S. Cl.
CPC ..... *G01R 29/0885* (2013.01); *G01R 29/0814* (2013.01); *G01R 29/0892* (2013.01); *G01R 29/0871* (2013.01)

(58) Field of Classification Search
CPC ............ G01R 29/0885; G01R 29/0814; G01R 29/0892; G01R 29/0871; G01B 29/0892
(Continued)

(56) References Cited

U.S. PATENT DOCUMENTS 6,111,416 A * 8/2000 Zhang ................ G01N 21/3581
324/244.1
6,414,473 B1 * 7/2002 Zhang ................ G01R 29/0885
324/244.1
(Continued)

FOREIGN PATENT DOCUMENTS

JP 2000-514549 A 10/2000
JP 2001-343410 A 12/2001
(Continued)

OTHER PUBLICATIONS

Sathian, J., 2013. Investigation of the intensity dependence of amplitude noise in electro-optic phase modulators (Doctoral dissertation, Queensland University of Technology). (Year: 2013).*
(Continued)

*Primary Examiner* — Christopher P McAndrew
(74) *Attorney, Agent, or Firm* — Morgan, Lewis & Bockius LLP

(57) ABSTRACT

Provided is an electro-optic probe for detecting an electromagnetic wave, including: an electro-optic crystal; and an optical fiber optically coupled to the electro-optic crystal, wherein a direction of a unique axis of the electro-optic crystal and a polarization direction of light from the optical fiber that enters the electro-optic crystal are set to be in line with each other, or wherein a direction of a unique axis of the electro-optic crystal and a unique polarization direction of the optical fiber are set to be in line with each other.

13 Claims, 17 Drawing Sheets

(58) Field of Classification Search
USPC .......................................................... 324/96
See application file for complete search history.

(56) References Cited

U.S. PATENT DOCUMENTS

| | | | |
|---|---|---|---|
| 6,906,506 B1* | 6/2005 | Reano | G01R 1/071 |
| | | | 324/754.06 |
| 2006/0114003 A1* | 6/2006 | Onishi | G01R 29/0885 |
| | | | 324/632 |
| 2009/0066952 A1* | 3/2009 | Wu | G01R 29/0885 |
| | | | 356/365 |
| 2009/0274410 A1 | 11/2009 | Duvillaret et al. | |
| 2010/0118375 A1* | 5/2010 | Maleki | G02F 1/0353 |
| | | | 359/239 |
| 2010/0264904 A1* | 10/2010 | Wu | G01R 31/308 |
| | | | 324/97 |
| 2012/0017682 A1* | 1/2012 | Cozza | G01R 29/0871 |
| | | | 73/586 |

FOREIGN PATENT DOCUMENTS

| | | |
|---|---|---|
| JP | 2005-201819 A | 7/2005 |
| JP | 2005-214892 A | 8/2005 |
| JP | 2009-025053 A | 2/2009 |
| JP | 2009-192275 A | 8/2009 |
| JP | 2014-052272 A | 3/2014 |
| WO | 97/45747 A1 | 12/1997 |
| WO | 99/41619 A1 | 8/1999 |

OTHER PUBLICATIONS

Hisatake et al., "Visualization of the spatial-temporal evolution of continuous electromagnetic waves in the terahertz range based on photonics technology," Optica, 1: 365-371 (2014).
International Search Report issued in corresponding International Patent Application No. PCT/JP2016/069076 dated Sep. 13, 2016.
Extended European Search Report issued in counterpart European Patent Application No. 16817890.3 dated Feb. 25, 2019.
Takahashi et al., "Organic nonlinear optical DAST crystals for electro-optic measurement and terahertz wave generation," Journal of Photochemistry and Photobiology A: Chemistry, 183: 247-252 (2006).
Bharath et al., "Dielectric, optical and mechanical studies of phenolic polyene OH1 organic electrooptic crystal," Optics & Laser Technology, 63: 90-97 (2014).
C. Vicario et al., "Generation of 0.9-mJ THz pulses in DSTM pumped by a Cr:Mg2SiO4 laser" Optics Letters: vol. 39 No. 23: pp. 6632-6635 (2014).

\* cited by examiner

ELECTRO-OPTIC PROBE, ELECTROMAGNETIC WAVE MEASURING APPARATUS, AND ELECTROMAGNETIC WAVE MEASURING METHOD

TECHNICAL FIELD

The present invention relates to an electro-optic probe, an electromagnetic wave measuring apparatus, and an electromagnetic wave measuring method, and in particular relates to an electro-optic probe, an electromagnetic wave measuring apparatus, and an electromagnetic wave measuring method that use an electro-optic crystal.

This application claims priority to Japanese Patent Application No. 2015-130280 filed on Jun. 29, 2015, the disclosure of which is entirely incorporated herein by reference.

BACKGROUND ART

Various types of devices for detecting an electromagnetic wave using an electro-optic crystal and the like have been developed. As an example of such a technology for detecting an electromagnetic wave, for example, Patent Document 1 (JP 2005-214892A) discloses the following technology. That is, an electric field sensor including: a sensor head unit with an electro-optic crystal; a signal processing unit configured to detect a measurement target electric field based on an output of the sensor head unit; a polarization maintaining fiber configured to transmit light from the signal processing unit to the sensor head unit so that the light enters a first surface of the electro-optic crystal; and an optical fiber configured to transmit, to the signal processing unit, light that has propagated through the electro-optic crystal and has exited from a second surface of the electro-optic crystal that is opposite to the first surface, wherein the signal processing unit is provided with: a light source that emits linear polarized light so that the linear polarized light is transmitted to the sensor head unit by the polarization maintaining fiber; a linear polarized light generator that converts the light transmitted by the optical fiber into linear polarized light that has a polarization plane at a preset angle; a polarization separation element that separates the light output from the linear polarized light generator into S polarized light and P polarized light; a first light detector that photoelectrically converts the S polarized light; a second light detector that photoelectrically converts the P polarized light; a differential amplifier that subjects an output electric signal of the first light detector and an output electric signal of the second light detector to differential amplification; and an electric signal measuring apparatus that detects a measurement target electric field based on the output electric signals of the differential amplifier, wherein the angle of the polarization plane of the linear polarized light that enters the first surface of the electro-optic crystal is about 45 degrees with respect to either one of two electric principal axes of the electro-optic crystal, and the linear polarized light generator has a response speed that is lower than a lower limit of the frequency of the measurement target electric field.

Furthermore, Patent Document 2 (JP 2001-343410A) discloses the following technology. That is, an electric field probe including: an electro-optic crystal that is sensitive only to an electric field that is parallel or orthogonal to a traveling direction of laser light; a laser light emitting means for emitting laser light to the electro-optic crystal; an optical polarization detection means for receiving the laser light from the laser light emitting means that entered and was reflected off the electro-optic crystal, and converting a polarization change of the laser light into an intensity change of the laser light; a light detection means for converting the intensity change of the laser light converted by the optical polarization detection means into a detection signal indicating the intensity change of the electric signal; and an output means for outputting an intensity and phase of the detection signal detected by the light detection means.

Furthermore, Patent Document 3 (JP 2014-52272A) discloses the following technology. That is, an electromagnetic wave detection system including: a first light source; a second light source that emits light at a frequency different from that of the first light source; a first optical branching device that branches the light from the first light source into two; a second optical branching device that branches the light from the second light source into two; a first optical multiplexer that multiplexes one of the two streams of light branched by the first optical branching device and one of the two streams of light branched by the second optical branching device; a second optical multiplexer that multiplexes the other one of the two streams of light branched by the first optical branching device and the other one of the two streams of light branched by the second optical branching device; an oscillator that outputs an oscillation signal at a constant frequency; a frequency shifter that is interposed between the first optical branching device and the first optical multiplexer, between the second optical branching device and the first optical multiplexer, between the first optical branching device and the second optical multiplexer, or between the second optical branching device and the second optical multiplexer, and uses the oscillation signal from the oscillator to shift the frequency of light by the frequency of the oscillation signal; an RF signal generator that receives two types of light having different frequencies from the first optical multiplexer, generates a first RF (Radio Frequency) signal with a frequency equal to the difference between the two types of light, and emits the generated first RF signal to a measurement target; an RF signal detector that mixes the first RF signal that is transmitted through or reflected by the measurement target with LO (Local Oscillating) signals, which are the two types of light having different frequencies from the second optical multiplexer, subjects the resultant signal to heterodyne detection, and outputs a detection signal with a frequency equal to the difference between a frequency equal to the difference between the two types of light constituting the LO signals, and the frequency of the first RF signal; and a 2 phase lock-in detector that subjects the detection signal output by the RF signal detector to 2 phase lock-in detection using the oscillation signal output by the oscillator, and outputs an in-phase component that is in phase with the detection signal output by the RF signal detector, and an orthogonal component that has a phase orthogonal to the detection signal output by the RF signal detector.

CITATION LIST

Patent Document

Patent Document 1: JP 2005-214892A
Patent Document 2: JP 2001-343410A
Patent Document 3: JP 2014-52272A

DISCLOSURE OF THE INVENTION

Problem to be Solved by the Invention

Technology with which it is possible to measure an electromagnetic wave more suitably than the technologies disclosed in Patent Documents 1 to 3 is in demand.

The present invention was made in view of the above-described problem, and it is an object thereof to provide an electro-optic probe, an electromagnetic wave measuring apparatus, and an electromagnetic wave measuring method that can measure an electromagnetic wave suitably using an electro-optic crystal.

Means for Solving the Problem (1) To solve the above-described problem, an electro-optic probe according to one aspect of the invention relates to an electro-optic probe for detecting an electromagnetic wave, including: an electro-optic crystal; and an optical fiber optically coupled to the electro-optic crystal, wherein a direction of a unique axis of the electro-optic crystal and a polarization direction of light from the optical fiber that enters the electro-optic crystal are set to be in line with each other.

(6) To solve the above-described problem, an electro-optic probe according to an aspect of the invention relates to an electro-optic probe for detecting an electromagnetic wave, including: an electro-optic crystal; and an optical fiber optically coupled to the electro-optic crystal, wherein a direction of a unique axis of the electro-optic crystal and a unique polarization direction of the optical fiber are set to be in line with each other.

(7) To solve the above-described problem, an electromagnetic wave measuring apparatus according to an aspect of the invention includes: a light source: an electro-optic probe configured to receive light from the light source and an electromagnetic wave; an optical wavelength filter configured to receive light output from the electro-optic probe, and a light receiving element configured to convert light that has passed through the optical wavelength filter into an electric signal, wherein the electro-optic probe includes: an electro-optic crystal; and an optical fiber optically coupled to the electro-optic crystal, a direction of a unique axis of the electro-optic crystal and a polarization direction of light from the optical fiber that enters the electro-optic crystal being set to be in line with each other.

(8) To solve the above-described problem, an electromagnetic wave measuring apparatus according to an aspect of the invention includes: a light source; an electro-optic probe configured to receive light from the light source and an electromagnetic wave; an optical wavelength filter configured to receive light output from the electro-optic probe, and a light receiving element configured to convert light that has passed through the optical wavelength filter into an electric signal, wherein the electro-optic probe includes: an electro-optic crystal; and an optical fiber optically coupled to the electro-optic crystal, a direction of a unique axis of the electro-optic crystal and a unique polarization direction of the optical fiber being set to be in line with each other.

(9) To solve the above-described problem, an electromagnetic wave measuring method according to one aspect of the invention relates to an electromagnetic wave measuring method using an electro-optic probe that includes: an electro-optic crystal; and an optical fiber optically coupled to the electro-optic crystal, a direction of a unique axis of the electro-optic crystal and a polarization direction of light from the optical fiber that enters the electro-optic crystal being set to be in line with each other, the method including the steps of providing light from a light source to the electro-optic probe and providing an electromagnetic wave to the electro-optic probe; and measuring the electromagnetic wave based on light output from the electro-optic probe.

(10) To solve the above-described problem, an electromagnetic wave measuring method according to one aspect of the invention relates to an electromagnetic wave measuring method using an electro-optic probe that includes: an electro-optic crystal; and an optical fiber optically coupled to the electro-optic crystal, a direction of a unique axis of the electro-optic crystal and a unique polarization direction of the optical fiber being set to be in line with each other, the method including the steps of providing light from a light source to the electro-optic probe and providing an electromagnetic wave to the electro-optic probe; and measuring the electromagnetic wave based on light output from the electro-optic probe.

Effects of the Invention

According to the present invention, it is possible to measure an electromagnetic wave suitably using an electro-optic crystal.

DESCRIPTION OF EMBODIMENTS

Figure 1:
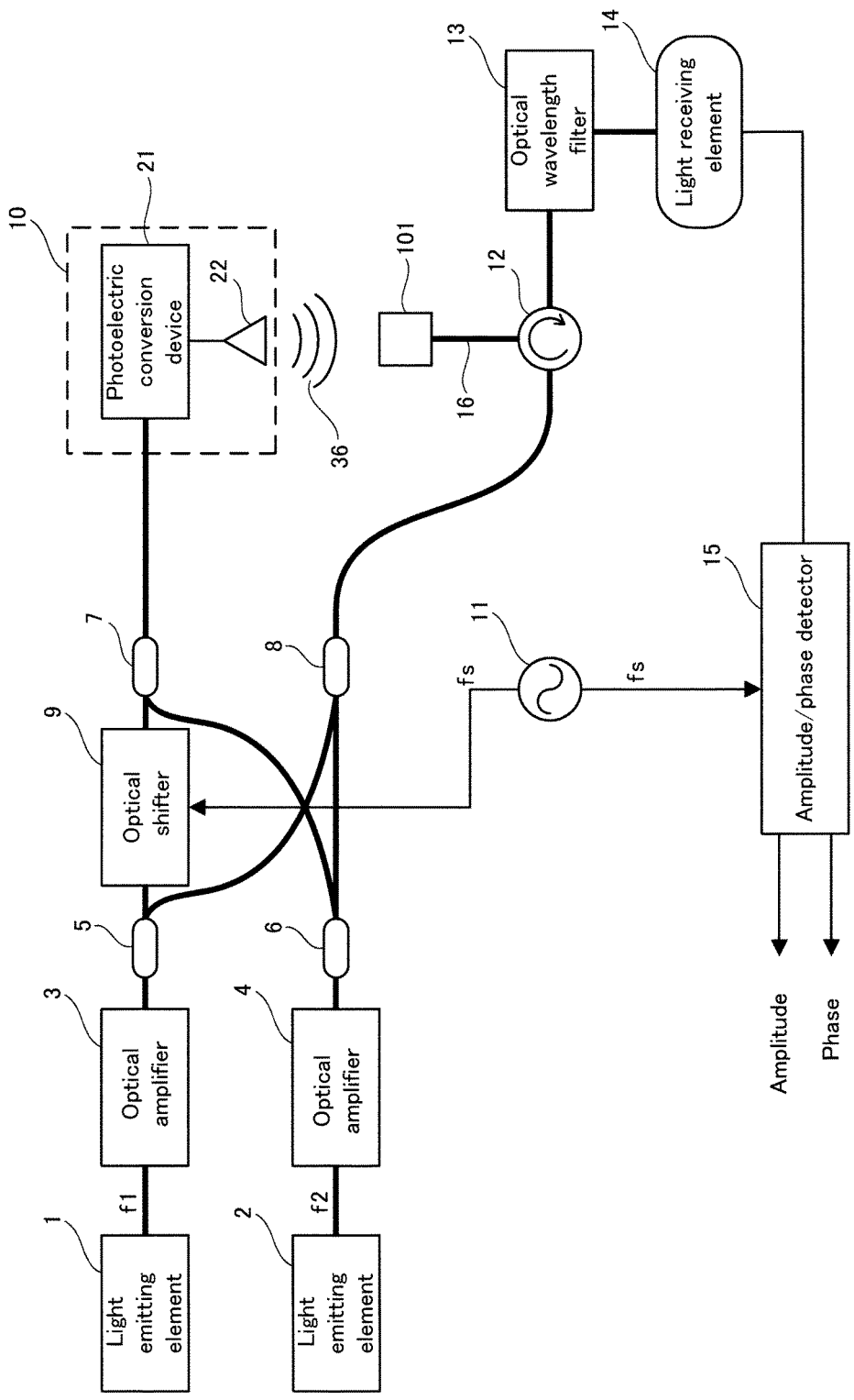
FIG. 1 is a diagram illustrating a configuration of an electromagnetic wave measuring apparatus according to a first embodiment of the present invention.

First, details of embodiments of the present invention will be described in order.

(1) An electro-optic probe according to an embodiment of the present invention relates to an electro-optic probe for detecting an electromagnetic wave, including; an electro-optic crystal; and an optical fiber optically coupled to the electro-optic crystal, wherein a direction of a unique axis of the electro-optic crystal and a polarization direction of light from the optical fiber that enters the electro-optic crystal are set to be in line with each other.

With such a configuration, it is possible to align the polarization direction of probe light that enters an electro-optic crystal with the unique axis of the electro-optic crystal that above all has a large electro-optic effect. Also, with a configuration in which the probe light whose polarization direction is in line with the direction of the unique axis is used, and a detection target electromagnetic wave and the probe light interact with each other in the electro-optic crystal, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

(2) Preferably, the electro-optic crystal may be naturally birefringent.

With a configuration using such an electro-optic crystal that is naturally birefringent and for which there are many types with a large electro-optic constant, it is possible to further improve the detection sensitivity while achieving an effect of improving the measurement stability by eliminating the adverse effects of birefringence. Furthermore, in the technologies disclosed in Patent Documents 1 and 2, the polarization state of probe light largely varies due to fluctuations in the natural birefringence due to temperature or the like, and the variation largely affects fluctuations in the detection sensitivity. In contrast, with a configuration that is not based on the measurement principle of electric field measurement using polarization modulation, and in which, specifically, the polarization direction of probe light that enters the electro-optic crystal is aligned with the unique axis of the electro-optic crystal, a change in the modulation efficiency due to the fluctuations in temperature is significantly small, and thus it is possible to realize the state in which measurement is unlikely to be affected by the disturbance, making it possible to stably measure the amplitude and phase of the detection target electromagnetic wave.

(3) Preferably, the electro-optic crystal may be an organic nonlinear optical crystal.

Accordingly, with a configuration in which, for example, an organic nonlinear optical crystal, which can often achieve a larger electro-optic effect than an inorganic optical crystal, is used as the electro-optic crystal, it is possible to further improve the detection sensitivity.

(4) More preferably, the electro-optic crystal may be DAST (4-N,N-dimethylamino-4'-N'-methyl-stilbazolium tosylate), DASC (4-N,N-dimethylamino-4'-N'-methyl-stilbazolium p-chlorobenzenesulfonate), DSTMS (4-N,N-dimethylamino-4'-N'-methyl-stilbazolium 2,4,6-trimethylbenzenesulfonate), or OH1 (2-(3-(4-Hydroxystyryl)-5,5-dimethylcydohex-2-enylidene)malononitrile).

Accordingly, with a configuration in which an organic nonlinear optical crystal, which has a particularly large electro-optic constant, is used as the electro-optic crystal, it is possible to significantly improve the detection sensitivity, while suppressing fluctuations in the natural birefringence ratio by aligning the polarization direction of probe light that enters the electro-optic crystal with the unique axis of the electro-optic crystal.

(5) Preferably, the optical fiber may be a polarization maintaining fiber, and a direction of a unique axis of the electro-optic crystal and a unique polarization direction of the optical fiber may be set to be in line with each other.

With such a configuration, it is possible to suppress disturbance in the polarization direction of light propagating in the optical fiber, and it is also possible to align the unique polarization direction of the optical fiber with the unique axis of the electro-optic crystal more reliably and easily.

(6) An electro-optic probe according to an embodiment of the present invention relates to an electro-optic probe for detecting an electromagnetic wave, including; an electro-optic crystal; and an optical fiber optically coupled to the electro-optic crystal, wherein a direction of a unique axis of the electro-optic crystal and a unique polarization direction of the optical fiber are set to be in line with each other.

With such a configuration, for example, even if the polarization direction of light from the optical fiber that enters the electro-optic crystal is not in line with the direction of a unique axis of the electro-optic crystal, it is possible, for example, to separate and extract the polarization component in the unique axis direction of the electro-optic crystal, using a polarization separation element or the like. Accordingly, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

(7) An electromagnetic wave measuring apparatus according to an embodiment of the present invention relates to an electromagnetic wave measuring apparatus including: a light source: an electro-optic probe configured to receive light from the light source and an electromagnetic wave; an optical wavelength filter configured to receive light output from the electro-optic probe, and a light receiving element configured to convert light that has passed through the optical wavelength filter into an electric signal, wherein the electro-optic probe includes: an electro-optic crystal; and an optical fiber optically coupled to the electro-optic crystal, a direction of a unique axis of the electro-optic crystal and a polarization direction of light from the optical fiber that enters the electro-optic crystal being set to be in line with each other.

With such a configuration, it is possible to align the polarization direction of probe light that enters an electro-optic crystal with the unique axis of the electro-optic crystal that above all has a large electro-optic effect. Also, with a configuration in which probe light whose polarization direction is aligned with the direction of the unique axis is used, and a detection target electromagnetic wave and the probe light interact with each other in the electro-optic crystal, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

(8) An electromagnetic wave measuring apparatus according to an embodiment of the present invention relates to an electromagnetic wave measuring apparatus including: a light source; an electro-optic probe configured to receive light from the light source and an electromagnetic wave; an optical wavelength filter configured to receive light output from the electro-optic probe, and a light receiving element configured to convert light that has passed through the optical wavelength filter into an electric signal, wherein the electro-optic probe includes: an electro-optic crystal; and an optical fiber optically coupled to the electro-optic crystal, a direction of a unique axis of the electro-optic crystal and a unique polarization direction of the optical fiber being set to be in line with each other.

With such a configuration, for example, even if the polarization direction of light from the optical fiber that enters the electro-optic crystal is not in line with the direction of a unique axis of the electro-optic crystal, it is possible, for example, to separate and extract the polarization component in the unique axis direction of the electro-optic crystal, using a polarization separation element or the like. Accordingly, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

(9) An electromagnetic wave measuring method according to an embodiment of the present invention relates to an electromagnetic wave measuring method using an electro-optic probe that includes: an electro-optic crystal; and an optical fiber optically coupled to the electro-optic crystal, a direction of a unique axis of the electro-optic crystal and a polarization direction of light from the optical fiber that enters the electro-optic crystal being set to be in line with each other, the method including the steps of providing light from a light source to the electro-optic probe and providing an electromagnetic wave to the electro-optic probe; and measuring the electromagnetic wave based on light output from the electro-optic probe.

With this, it is possible to align the polarization direction of probe light that enters an electro-optic crystal with the unique axis of the electro-optic crystal that above all has a large electro-optic effect. Also, with a configuration in which probe light whose polarization direction is aligned with the direction of the unique axis is used, and a detection target electromagnetic wave and the probe light interact with each other in the electro-optic crystal, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

(10) An electromagnetic wave measuring method according to an embodiment of the present invention relates to an electromagnetic wave measuring method using an electro-optic probe that includes: an electro-optic crystal; and an optical fiber optically coupled to the electro-optic crystal, a direction of a unique axis of the electro-optic crystal and a unique polarization direction of the optical fiber being set to be in line with each other, the method including the steps of providing light from a light source to the electro-optic probe and providing an electromagnetic wave to the electro-optic probe; and measuring the electromagnetic wave based on light output from the electro-optic probe.

With this, for example, even if the polarization direction of light from the optical fiber that enters the electro-optic crystal is not in line with the direction of a unique axis of the electro-optic crystal, it is possible, for example, to separate and extract the polarization component in the unique axis direction of the electro-optic crystal, using a polarization separation element or the like. Accordingly, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

The electromagnetic wave measuring apparatus according to an embodiment of the present invention includes: a first light source; a second light source that emits light at a frequency different from that of the first light source; an electro-optic probe that receives the light from the first light source and the light from the second light source; an optical electromagnetic wave conversion unit that receives the light from the first light source and the light from the second light source, generates an electromagnetic wave that has a frequency equal to the difference between the frequencies of the received light, and radiates the generated electromagnetic wave to the electro-optic probe; and an optical shifter that is provided between the first light source or the second light source, and the optical electromagnetic wave conversion unit or the electro-optic probe, and is configured to shift the frequency of received light, and outputs the resultant light. The electro-optic probe includes: an electro-optic crystal; and an optical fiber optically coupled to the electro-optic crystal, wherein a direction of a unique axis of the electro-optic crystal and a polarization direction of light from the optical fiber that enters the electro-optic crystal are set to be in line with each other.

With such a configuration, it is possible to align the polarization direction of probe light that enters an electro-optic crystal with the unique axis of the electro-optic crystal that above all has a large electro-optic effect. Also, with a configuration in which probe light whose polarization direction is in line with the direction of the unique axis is used, and a detection target electromagnetic wave and the probe light interact with each other in the electro-optic crystal, it is possible, for example, to maximize the detection sensitivity due to a large electro-optic effect, that is, to realize highly-sensitive electric field measurement. Accordingly, it is possible to suitably measure an electromagnetic wave using an electro-optic crystal. Furthermore, with a configuration in which a frequency shifter, that is, an optical shifter shifts the frequency of light output from at least one light source, and types of probe light of at least two different frequencies enter the electro-optic crystal, it is possible to measure, in real time, phase information, which needs to be measured at two positions or more in a configuration in which no frequency is shifted or one type of probe light enters the electro-optic crystal.

The electromagnetic wave measuring method according to an embodiment of the present invention relates to an electromagnetic wave measuring method using an electrooptic probe that includes: an electro-optic crystal; and an optical fiber optically coupled to the electro-optic crystal, wherein a direction of a unique axis of the electro-optic crystal and a polarization direction of light from the optical fiber that enters the electro-optic crystal are set to be in line with each other, the method including the steps of providing light from the first light source and light from the second light source that emits light at a frequency different from that of the first light source to the electro-optic probe, radiating an electromagnetic wave that has a frequency equal to the difference between either one of the frequencies of the first light source and the second light source, and a frequency obtained by shifting the other one of the frequencies of the first light source and the second light source to the electro-optic probe, or giving the light from either one of the first light source and the second light source, and light obtained by shifting the frequency of the light from the other one of the first light source and the second light source to the electro-optic probe, and radiating an electromagnetic wave that has a frequency equal to the difference between the frequency of the first light source and the frequency of the second light source to the electro-optic probe; and measuring the electromagnetic wave based on light output from the electro-optic probe.

Accordingly, it is possible to align the polarization direction of probe light that enters an electro-optic crystal with the unique axis of the electro-optic crystal that above all has a large electro-optic effect. Also, with a configuration in which probe light whose polarization direction is aligned with the direction of the unique axis is used, and a detection target electromagnetic wave and the probe light interact with each other in the electro-optic crystal, it is possible, for example, to maximize the detection sensitivity due to a large electro-optic effect, that is, to realize highly-sensitive electric field measurement. Accordingly, it is possible to suitably measure an electromagnetic wave using an electro-optic crystal. Furthermore, with a configuration in which a frequency shifter, that is, an optical shifter shifts the frequency of light output from at least one light source, and types of probe light of at least two different frequencies enter the electro-optic crystal, it is possible to measure, in real time, phase information, which needs to be measured at two positions or more in a configuration in which no frequency is shifted or one type of probe light enters the electro-optic crystal.

Hereinafter, embodiments of the present invention will be described with reference to the drawings. Note that, in the drawings, the same reference numerals are given to the same or corresponding components in the drawings, and redundant descriptions thereof are not repeated. Furthermore, at least parts of the embodiments described below may be suitably combined.

First Embodiment

FIG. 1 is a diagram illustrating a configuration of an electromagnetic wave measuring apparatus according to a first embodiment of the present invention.

Referring to FIG. 1, an electromagnetic wave measuring apparatus 201 is provided with: light emitting elements (light sources) 1 and 2; optical amplifiers 3 and 4; optical branching devices 5 and 6; optical multiplexers 7 and 8; an optical shifter 9; an optical electromagnetic wave conversion unit 10; an oscillator 11; a circulator 12; an optical wavelength filter 13; a light receiving element 14; an amplitude/phase detector 15; and an electro-optic probe 101. The optical electromagnetic wave conversion unit 10 includes a photoelectric conversion device 21, and an antenna 22.

Optical transmission between the constituent components of the electromagnetic wave measuring apparatus 201 is at least partially performed using an optical fiber 16. The antenna 22 is, for example, a horn antenna.

The light emitting element 1 emits light at a frequency f1. The light emitting element 2 emits light at a frequency f2, which is different from the frequency f1. The frequency f1 and the frequency f2 are, for example, frequencies in a 1.5 μm band. Furthermore, a difference between the frequency f1 and the frequency f2 is, for example, 125 GHz in a terahertz band. Note that a difference between the frequency f1 and the frequency f2 may be in a frequency band other than a terahertz band, and may be in a microwave band or a millimeter waveband, for example. Hereinafter, description will be given taking a case where f2>f1 is met as an example.

The optical amplifier 3 is, for example, an EDFA (Erbium Doped Fiber Amplifier), and is configured to amplify the light output from the light emitting element 1 and output the amplified light to the optical branching device 5.

The optical branching device 5 branches the light received from the optical amplifier 3, and outputs the branched light to the optical shifter 9 and the optical multiplexer 8.

The optical amplifier 4 is, for example, an EDFA, and is configured to amplify the light output from the light emitting element 2 and output the amplified light to the optical branching device 6.

The optical branching device 6 branches the light received from the optical amplifier 4, and outputs the branched light to the optical multiplexers 7 and 8.

The optical multiplexer 8 multiplexes the light received from the optical branching device 5 and the light received from the optical branching device 6, and outputs the resultant light to the electro-optic probe 101 via the circulator 12.

The oscillator 11 generates oscillation signals of a frequency fs, and outputs the generated signals to the optical shifter 9 and the amplitude/phase detector 15. The frequency fs is at 500 kHz, for example.

The optical shifter 9 is provided on an optical transmission path between the light emitting element 1 and the optical electromagnetic wave conversion unit 10, and is configured to shift the frequency of received light and output the resultant light. More specifically, the optical shifter 9 shifts the frequency of the light received from the optical branching device 5 by the frequency fs of the oscillation signal received from the oscillator 11, and outputs the resultant light to the optical multiplexer 7.

The optical multiplexer 7 multiplexes the light received from the optical shifter 9 and the light received from the optical branching device 6, and outputs the resultant light to the photoelectric conversion device 21.

Upon receiving the light from the light emitting element 1 and the light from the light emitting element 2, the optical electromagnetic wave conversion unit 10 generates a detection target electromagnetic wave 36 that has a frequency equal to the difference between the frequencies of the received types of light, and radiates the generated detection target electromagnetic wave 36 to the electro-optic probe 101.

More specifically, the photoelectric conversion device 21 includes, for example, a light receiving element, and is configured to generate, based on the light of two types of frequencies received from the optical multiplexer 7, the detection target electromagnetic wave 36 that has a frequency component equal to the difference between the two frequencies, and emit the generated detection target electromagnetic wave 36 to a measurement target from the antenna 22.

The electro-optic probe 101 is arranged at a position at which it can be irradiated with the electromagnetic wave via the antenna 22, such as a position at which it faces the antenna 22. That is, the measurement target may be arranged between the antenna 22 and the electro-optic probe 101, may include the antenna 22, or may be the antenna 22 itself.

The electro-optic probe 101 detects the detection target electromagnetic wave 36. More specifically, light transmitted from the circulator 12 to the electro-optic probe 101 interacts with, at the electro-optic probe 101, the detection target electromagnetic wave 36 from the antenna 22, is reflected, and is output to the circulator 12. Then, the light is output to the optical wavelength filter 13 from the circulator 12.

The optical wavelength filter 13 dampens components of frequency components of the light received from the circulator 12 that are outside a predetermined frequency band, for example.

The light receiving element 14 converts the light that has passed through the optical wavelength filter 13 into an electric signal, and outputs the converted signal to the amplitude/phase detector 15.

The amplitude/phase detector 15 uses the oscillation signal received from the oscillator 11 to detect the amplitude and phase of the electric signal received from the light receiving element 14, and outputs signals respectively indicating the detected amplitude and phase.

As described above, the electromagnetic wave measuring apparatus 201 can conduct, using an optical technique, electromagnetic wave measurement in a broad band ranging from a low frequency to a high frequency while changing, for example, the position of the electro-optic probe 101, to measure the space distribution of the electric field of an electromagnetic wave. Furthermore, it is possible to measure the amplitude and phase of an electric field in real time.

Note that the configuration of the optical shifter 9 is not limited to one in which it is provided between the optical branching device 5 and the optical multiplexer 7, and may be one in which it is provided between the optical branching device 6 and the optical multiplexer 8, between the optical branching device 5 and the optical multiplexer 8, or between the optical branching device 6 and the optical multiplexer 7.

In other words, the optical shifter 9 is provided between the light emitting element 1 or the light emitting element 2, and the optical electromagnetic wave conversion unit 10 or the electro-optic probe 101, and is configured to shift the frequency of received light and output the resultant light. In other words, the optical shifter 9 shifts the frequency of light from the light emitting element 1 or the light emitting element 2, and outputs the resultant light to the electro-optic probe 101 or the optical electromagnetic wave conversion unit 10.

Furthermore, the configuration of the electromagnetic wave measuring apparatus 201 is not limited to one in which it includes one optical shifter, and may be one in which it includes, for example, two optical shifters. Specifically, a configuration is also possible in which, for example, in addition to the optical shifter 9, another optical shifter is provided between the optical branching device 6 and the optical multiplexer 8, and the frequency shift directions of the optical shifters are set opposite to each other. Furthermore, if the electromagnetic wave measuring apparatus 201 includes two or more optical shifters, then the frequency of an oscillation signal to be given to the amplitude/phase detector 15 needs only to be set appropriately based on, for example, the positions and the shift directions of the optical shifters.

Figure 2:
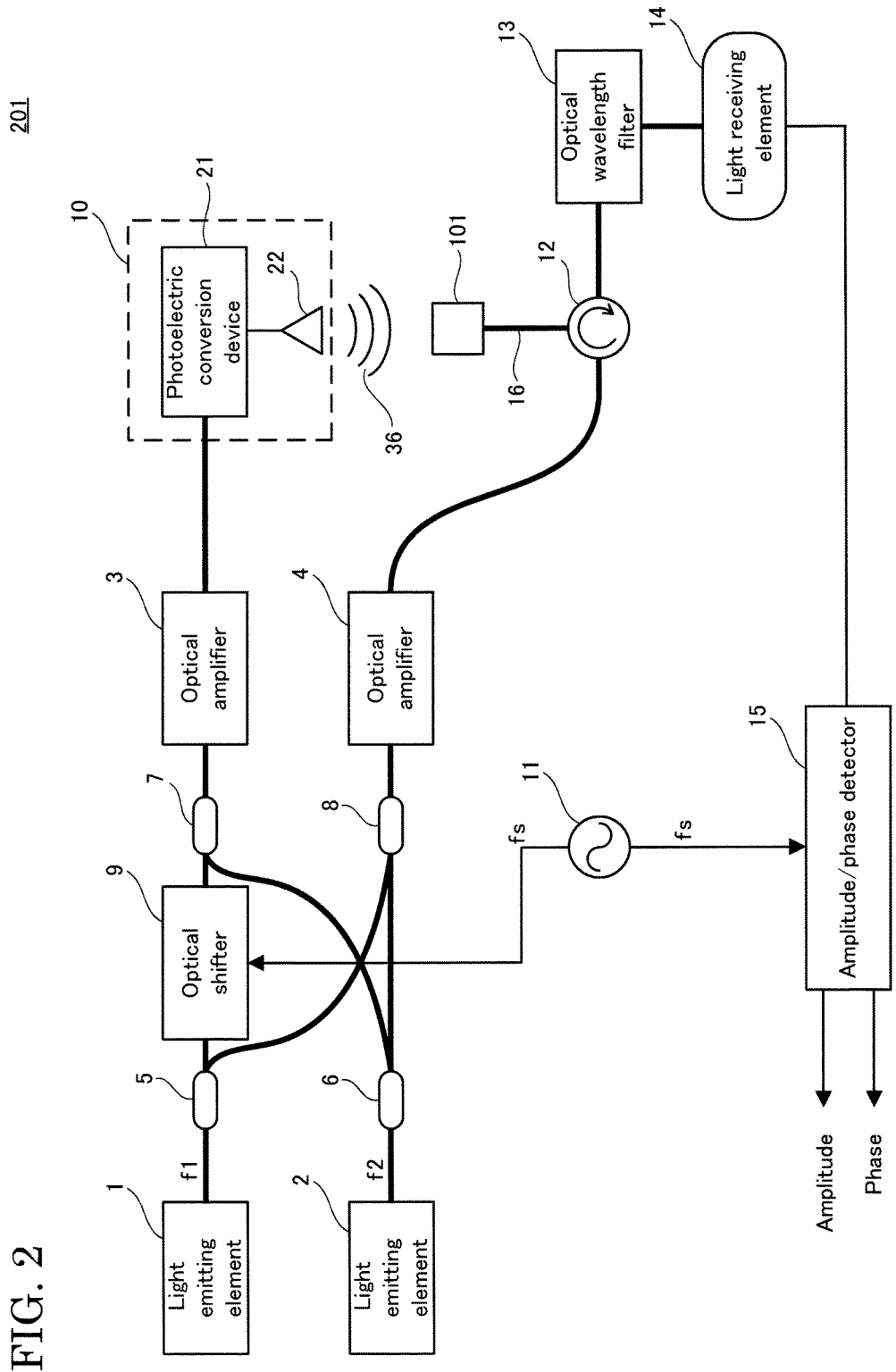
FIG. 2 is a diagram illustrating a configuration of a modification of the electromagnetic wave measuring apparatus according to the first embodiment of the present invention.

FIG. 2 is a diagram illustrating a configuration of a modification of the electromagnetic wave measuring apparatus according to the first embodiment of the present invention.

The positions of the optical amplifiers 3 and 4 are not limited to the positions shown in FIG. 1. Specifically, referring to FIG. 2, for example, the optical amplifier 3 is arranged between the optical multiplexer 7 and the photoelectric conversion device 21. Furthermore, the optical amplifier 4 is arranged between the optical multiplexer 8 and the circulator 12.

The optical branching device 5 branches light output from the light emitting element 1 and outputs the branched light to the optical shifter 9 and the optical multiplexer 8. The optical branching device 6 branches light output from the light emitting element 2, and outputs the branched light to the optical multiplexers 7 and 8.

The optical multiplexer 8 multiplexes the light received from the optical branching device 5 and the light received from the optical branching device 6, and outputs the resultant light to the optical amplifier 4.

The optical amplifier 4 is, for example, an EDFA, and is configured to amplify the light received from the optical multiplexer 8 and output the amplified light to the electro-optic probe 101 via the circulator 12.

The optical multiplexer 7 multiplexes the light received from the optical shifter 9 and the light received from the optical branching device 6, and outputs the resultant light to the optical amplifier 3.

The optical amplifier 3 is, for example, an EDFA, and is configured to amplify the light received from the optical multiplexer 7 and output the amplified light to the photoelectric conversion device 21.

Furthermore, the optical amplifier needs only to be arranged if it is necessary to increase the intensity of light, and the electromagnetic wave measuring apparatus 201 may have a configuration not including at least either one of the optical amplifiers 3 and 4. Furthermore, the electromagnetic wave measuring apparatus 201 may have a configuration not including the optical wavelength filter 13.

Figure 3:
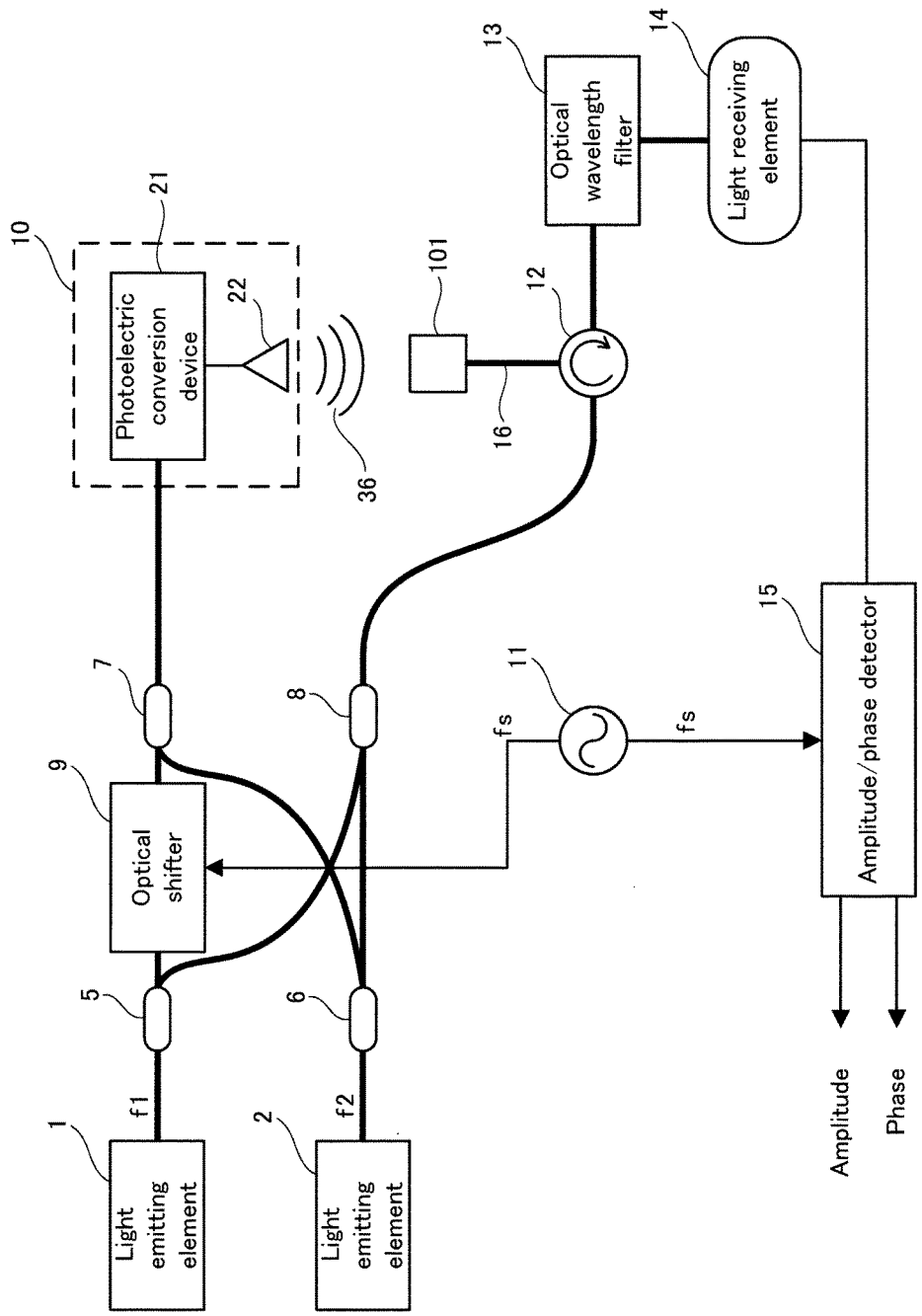
FIG. 3 is a diagram illustrating a configuration of a modification of the electromagnetic wave measuring apparatus according to the first embodiment of the present invention.

FIG. 3 is a diagram illustrating a configuration of a modification of the electromagnetic wave measuring apparatus according to the first embodiment of the present invention.

Referring to FIG. 3, the modification of the electromagnetic wave measuring apparatus 201 is configured not to include the optical amplifiers 3 and 4, in contrast to the electromagnetic wave measuring apparatus 201 shown in FIG. 1.

Figure 4:
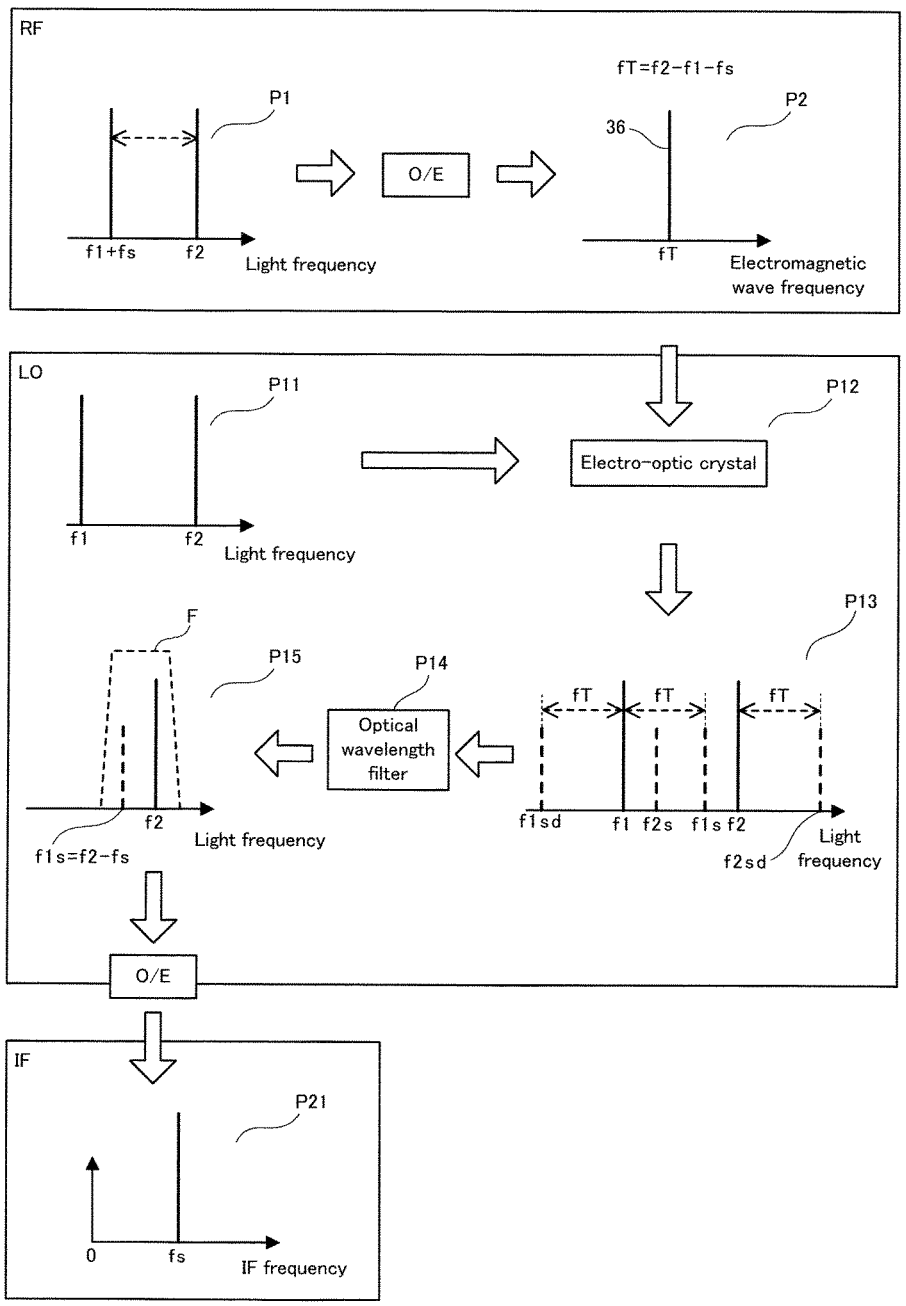
FIG. 4 is a diagram illustrating the measurement principle of the electromagnetic wave measuring apparatus according to the first embodiment of the present invention.

FIG. 4 is a diagram illustrating the measurement principle of the electromagnetic wave measuring apparatus according to the first embodiment of the present invention.

Referring to FIGS. 1 and 4, the electromagnetic wave measuring apparatus 201 uses a CW (continuous wave), for example.

More specifically, on the RF (Radio Frequency) side, that is, in the system of the detection target electromagnetic wave 36, the optical shifter 9 generates light of a frequency (f1+fs), and the photoelectric conversion device 21 receives light obtained as a result of the optical multiplexer 7 multiplexing the light of the frequency (f1+fs) and the light of the frequency f2 (phase P1).

The photoelectric conversion device 21 performs photoelectric conversion (O/E), and more specifically generates a detection target electromagnetic wave 36 that has a frequency component equal to the difference between the received two types of light frequencies, that is, a frequency fT=f2−f1−fs (phase P2). The detection target electromagnetic wave 36 is radiated in the direction of an electro-optic crystal 52 of the electro-optic probe 101 (phase P12).

On the other hand, on the LO (Local) side, that is, in the system of the probe light, light obtained as a result of the optical multiplexer 8 multiplexing the light of the frequency f1 and the light of the frequency f2 serves as probe light, and is transmitted to the electro-optic crystal 52 of the electro-optic probe 101 (phases P11 and P12).

The components of the frequency f1 and the frequency f2 of the probe light are modulated in the electro-optic crystal 52 to which the detection target electromagnetic wave 36 is radiated, and types of light in modulated sidebands, specifically, types of light of frequency components f1s=f1+fT=f2−fs, f2s=f2−fT=f1+fs, f1sd=f1−fT, and f2sd=f2+fT are generated (phase P13). The generated types of light are transmitted, together with the probe light of the frequency f1 and the frequency f2, to the optical wavelength filter 13 (phase P14).

At the optical wavelength filter 13 having a passband F, for example, the probe light of the frequency f2 and the light of the frequency f1s in the modulated sideband are extracted (phase P15).

The light extracted at the optical wavelength filter 13 is transmitted to the light receiving element 14, and is subjected to photoelectric conversion (O/E), and an electric signal of the frequency fs=f2−f1s in an IF (Intermediate frequency) band is obtained (phase P21).

Taking an example with specific numeric values, in the electromagnetic wave measuring apparatus 201, for example, a difference between the frequencies of the light emitting elements 1 and 2 is set to 125 GHz, and light output from the light emitting element 1 is branched into two streams one of which is passed through the optical shifter 9 so as to have a frequency shifted by 500 kHz. As a result, the frequency difference between the two types of light travelling toward the photoelectric conversion device 21 is obtained by (125 GHz-500 kHz).

On the other hand, the frequency difference between the two types of probe light travelling toward the electro-optic probe 101 is obtained as 125 GHz.

Also, when the detection target electromagnetic wave 36, that is, the detection target electromagnetic wave 36 that has a frequency component equal to the frequency difference (125 GHz-500 kHz) between the two types of light travelling to the photoelectric conversion device 21 is radiated to the electro-optic probe 101, then the modulated sidebands are respectively generated for the two types of probe light due to the electro-optic effect of the electro-optic crystal 52.

Then, based on the light having passed through the optical wavelength filter 13, an electric signal of 500 kHz is obtained as an output from the light receiving element 14.

Note that a configuration is also possible in which, at the optical wavelength filter 13 having the passband F, for example, the probe light of the frequency f1 and the light of the frequency f2s=f1+fs in the modulated sideband are extracted.

Referring to FIG. 1, the amplitude/phase detector 15 is, for example, a lock-in amplifier that includes a mixer, a filter, a phase shifter and the like, and is configured to use the oscillation signal of the frequency fs received from the oscillator 11 to generate an electric signal in a baseband based on the electric signal in the IF band received from the light receiving element 14, and detect the amplitude and phase of the electric signal in the IF band, that is, the amplitude and phase of a modulated sideband component.

As described above, the electromagnetic wave measuring apparatus 201 can measure an electric field, i.e., the amplitude and phase, of the detection target electromagnetic wave 36.

Here, as a method for improving the detection sensitivity, it is conceivable to use, as the electro-optic crystal of the electro-optic probe that is used in electromagnetic wave measurement, an electro-optic crystal that is naturally birefringent and for which there are many types with a larger electro-optic constant than that of an electro-optic crystal that is not naturally birefringent such as ZnTe (zinc telluride).

However, in the technology disclosed in Patent Document 1, the polarization plane of the linear polarized light is inclined at about 45 degrees with respect to either one of two electric principal axes of the electro-optic crystal, and thus, if a naturally birefringent electro-optic crystal that has the maximum electro-optic effect in an electric principal axis is used, then the electricity/light conversion efficiency is reduced in accordance with the inclination angle, and the detection sensitivity deteriorates.

Furthermore, the technology disclosed in Patent Document 2 is an electric field measuring method to which polarization modulation of probe light is applied, and thus, if a naturally birefringent electro-optic crystal is used, then fluctuation caused by, for example, disturbance in the naturally birefringent properties of the electro-optic crystal itself directly affects fluctuations in the detection sensitivity, and thus the measurement stability deteriorates. Furthermore, variation in a polarized wave propagating in the optical fiber also induces variation in the detection sensitivity, thus deteriorating the measurement stability. In order to avoid polarization modulation resulting from such disturbances, it is necessary to provide a separate polarization stabilizing system, which results in a complex and expensive measurement system.

In order to solve the above-described problems, the applicants of the present application have arrived at an idea of employing a configuration using an optical wavelength filter and a light receiving element that is not based on the measurement principle of electric field measurement using polarization modulation, as described above, and using a naturally birefringent electro-optic crystal. The configuration serves as an example of the electromagnetic wave measuring apparatus according to the embodiment of the present invention.

Here, the applicants of the present application conducted the following experiments.

Figure 5:
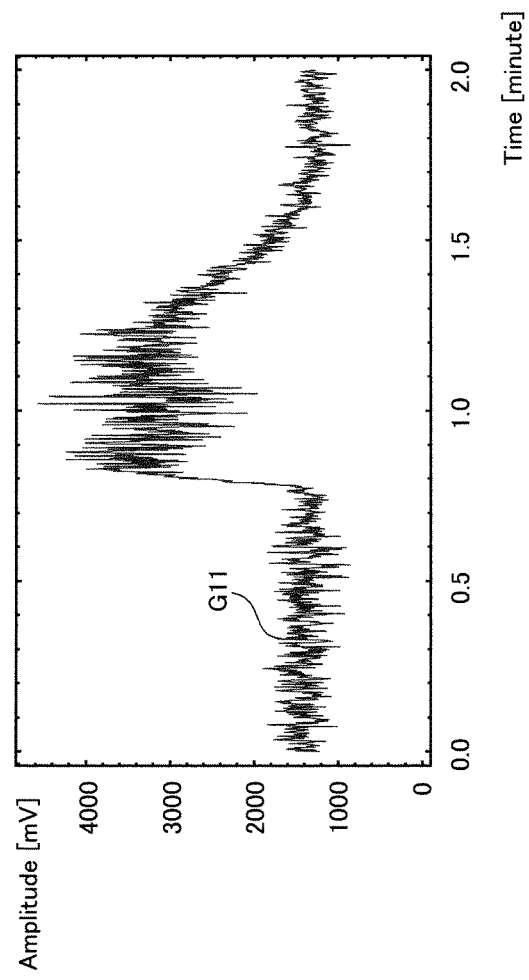
FIG. 5 is a diagram illustrating an example of a measurement result in a comparative example of the electromagnetic wave measuring apparatus according to the first embodiment of the present invention.
Figure 6:
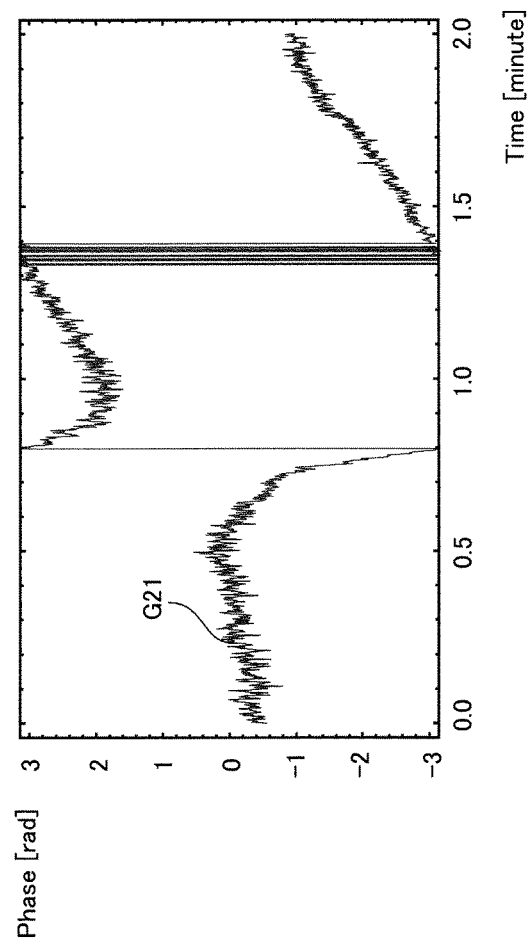
FIG. 6 is a diagram illustrating an example of a measurement result in the comparative example of the electromagnetic wave measuring apparatus according to the first embodiment of the present invention.

FIGS. 5 and 6 are diagrams illustrating an example of a measurement result in a comparative example of the electromagnetic wave measuring apparatus according to the first embodiment of the present invention.

In FIG. 5, the vertical axis denotes amplitudes [mV], and the horizontal axis denotes time [minutes]. In FIG. 6, the vertical axis denotes phases [rad], and the horizontal axis denotes time [minutes].

In the measurement, as the comparative example based on the above-described idea, an electromagnetic wave measuring apparatus was used in which the angle between the direction of a unique axis of the electro-optic crystal of the electro-optic probe 101 of the electromagnetic wave measuring apparatus 201 and the polarization direction of light from the optical fiber 16 that enters the electro-optic crystal was set to about 45 degrees as in the technology disclosed in Patent Document 1. Furthermore, a lock-in amplifier that has a lock-in frequency of 100 kHz, and has a lock-in time constant of 30 ms was used as the amplitude/phase detector 15. The amplitude shown in FIG. 5 is proportional to the amplitude of the detection target electromagnetic wave 36.

Furthermore, in the measurement, DAST (4-N,N-dimethylamino-4'-N'-methyl-stilbazolium tosylate), which is an organic nonlinear optical crystal, was used as the electro-optic crystal, and the electric field of the detection target electromagnetic wave 36 of 0.310 THz was measured for 2 minutes. Then, on the assumption that the electromagnetic wave measuring apparatus will be used in a non-laboratory environment such as outdoors, the temperature around the electro-optic probe 101 was changed by a few degrees during the measurement period.

Referring to FIGS. 5 and 6, graphs G11 and G21 show that the amplitude and the phase of the electric field of 0.310 THz in a space between the antenna 22 and the electro-optic probe 101 varied with time due to a probe of the comparative example of the electro-optic probe 101, even though they should actually be constant, and it was confirmed that the detection sensitivity varied.

Specifically, the amplitude largely varied in a range between about 1000 mV and about 4500 mV, and the phase largely varied at least in a range of ±π radian, and it was clear that unstable characteristics were obtained. Particularly, the unstable characteristics were noticeable in the phase detection.

The applicants of the present application found, in the experiment, a new problem that, in a simple configuration like the comparative example, fluctuations in the natural birefringence due to temperature or the like deteriorates the measurement stability. Also, the applicants of the present application found that the above-described problem could be solved using an electro-optic probe 101 having the following configuration.

Figure 7:
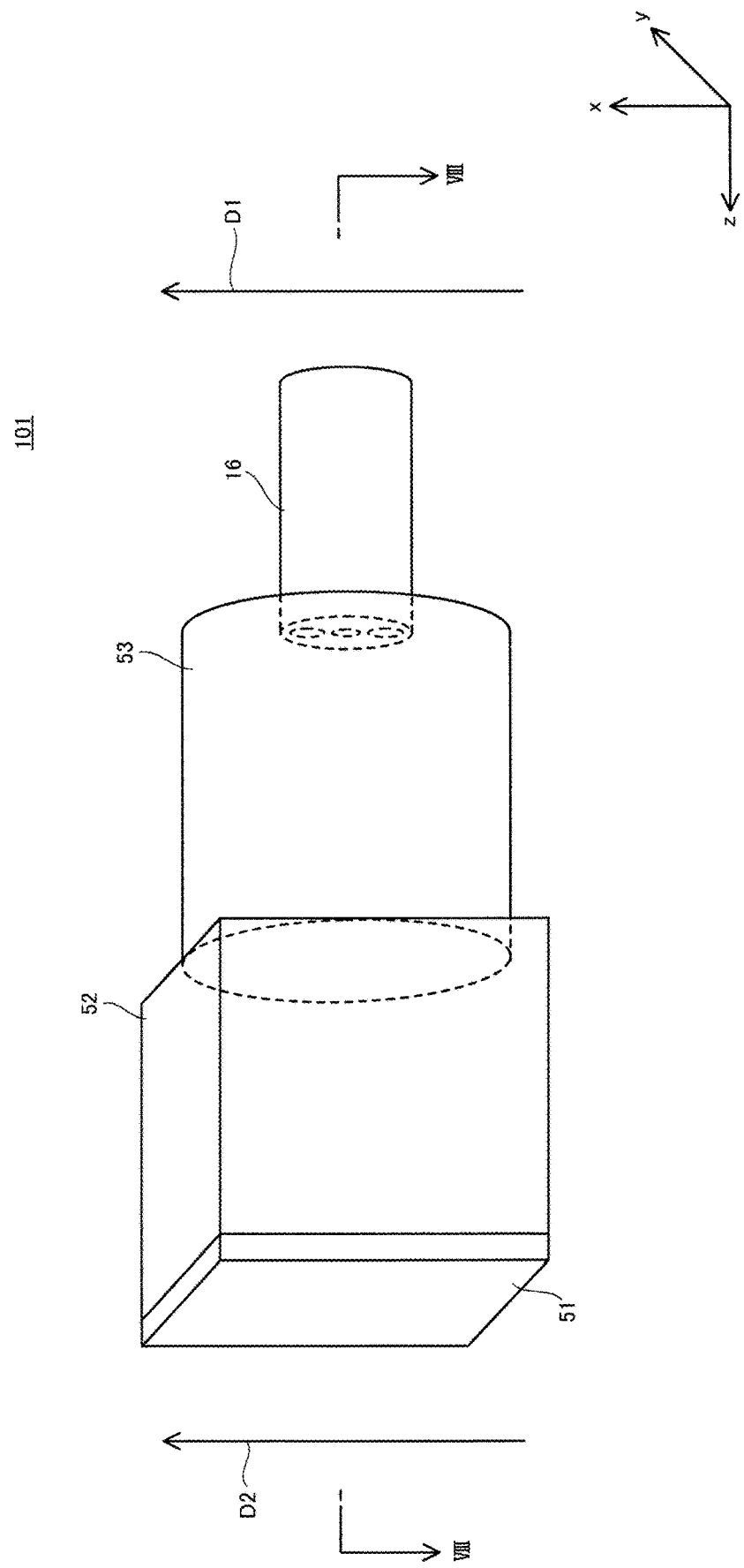
FIG. 7 is a perspective view schematically illustrating a configuration of an electro-optic probe according to the first embodiment of the present invention.
Figure 8:
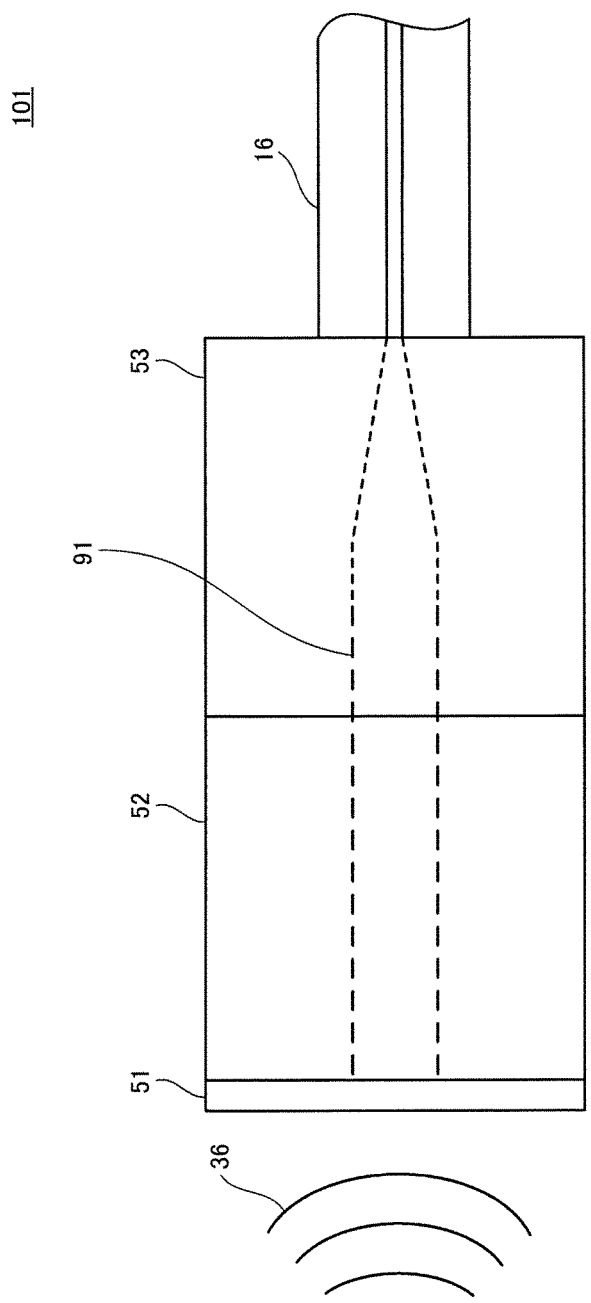
FIG. 8 is a cross-sectional view of the electro-optic probe according to the first embodiment of the present invention taken along a line VIII-VIII in FIG. 7.

FIG. 7 is a perspective view schematically illustrating a configuration of the electro-optic probe according to the first embodiment of the present invention. FIG. 8 is a cross-sectional view of the electro-optic probe according to the first embodiment of the present invention taken along a line VIII-VIII in FIG. 7.

Referring to FIGS. 7 and 8, the electro-optic probe 101 includes a reflecting unit 51, an electro-optic crystal 52, a lens 53, and the optical fiber 16.

The electro-optic crystal 52 and the optical fiber 16 are optically coupled to each other via the lens 53. More specifically, an end of the electro-optic crystal 52 and an end of the lens 53 are optically coupled to each other, and the end of the lens 53 opposite to that end and an end of the optical fiber 16 are optically coupled to each other. The optical fiber 16 is a polarization maintaining fiber (PMF), for example. The lens 53 is a GRIN (Gradient Index) lens, for example.

The reflecting unit 51 is optically coupled to the electro-optic crystal 52 at the end of the electro-optic crystal 52 that is opposite to the lens 53. The reflecting unit 51 is, for example, a total reflection mirror subjected to HR (High Reflector) coating.

The electro-optic crystal 52 is, for example, quadrangular prism-shaped and the lens 53 is, for example, column-shaped.

Light transmitted through the optical fiber 16, specifically, linear polarized light in which, for example, a polarization plane conforms to a unique polarization direction D1, that is, a slow axis or a fast axis, of the optical fiber 16 is converted by the lens 53 into parallel light as shown by dotted lines 91 in FIG. 8, and enters the electro-optic crystal 52, where the light interacts with the detection target electromagnetic wave 36 from the antenna 22 and is reflected by the reflecting unit 51. The reflected light enters the lens 53, is collected, and returns to the optical fiber 16.

Here, the unique axis direction of the electro-optic crystal 52 and the unique polarization direction of the optical fiber 16 are set to be in line with each other.

More specifically, a unique axis D2 of the electro-optic crystal 52, and the unique polarization direction D1, that is, the unique axis D1, of the optical fiber 16 are in line with the x axis direction, that is, with the direction perpendicular to the light traveling direction (z axis). In other words, the lens 53 and the optical fiber 16 of the electro-optic probe 101 are connected to each other so that the direction of the unique axis D2 of the electro-optic crystal 52 and the unique polarization direction D1 of the optical fiber 16 are in line with each other, for example, are in the same direction. The polarization plane of the linear polarized light in the electro-optic crystal 52 is substantially parallel to the unique axis D2 of the electro-optic crystal 52.

Here, the unique axis D2 extends, for example, in a unique polarization direction that corresponds to the direction in which probe light propagates in the electro-optic crystal 52. Ordinarily, light that propagates in a birefringent crystal in a single direction is obtained through linear coupling of linearly-polarized waves that are orthogonal to each other, that is, two unique waves. In the case of, for example, an anisotropic crystal, each mode has a unique polarization direction and refractive index.

Furthermore, preferably, the unique axis D2 is the axis of a plurality of unique axes of the electro-optic crystal 52 that can obtain the maximum electro-optic effect, and may be, for example, a principal axis of the electro-optic crystal 52. For example, of the principal axes, namely, the x axis, the y axis, and the z axis, of DAST, the x axis is the principal axis that can obtain the maximum electro-optic effect. More specifically, the principal axis that can obtain the maximum electro-optic effect is, for example, an axis that can obtain the maximum performance index $n^3 \times r$. Where n is a refractive index, and r is an electro-optic constant.

Furthermore, in the experiments using the DAST of the present description, the measurement was conducted in a state in which an "a" axis of the DAST and the unique polarization direction D1 of the optical fiber 16 were in line with each other, the state serving as the state in which the direction of the unique axis D2 and the slow axis, which is one of the unique polarization directions D1, of the optical fiber 16 are in line with each other. The "a" axis of the DAST is shifted by 5.4° with respect to the x axis of the DAST, which is one of the principal axes (dielectric principal axes).

Note that the electro-optic probe 101 may have a configuration not including the lens 53. Furthermore, a member such as a glass plate for distance modulation, for example, may also be provided between the electro-optic crystal 52 and the lens 53. Furthermore, the electro-optic probe 101 may also have a configuration not including the reflecting unit 51, for example, a configuration including an electro-optic crystal 52 subjected to HR coating.

Figure 9:
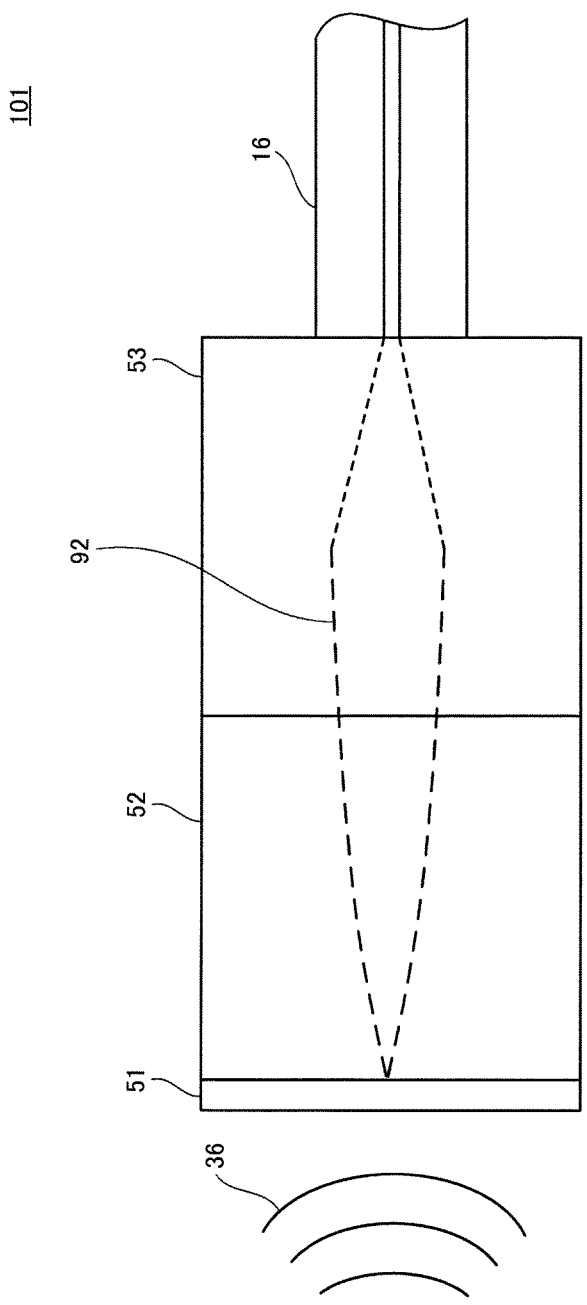
FIG. 9 is a cross-sectional view of a modification of the electro-optic probe according to the first embodiment of the present invention taken along a line VIII-VIII in FIG. 7.

FIG. 9 is a cross-sectional view of a modification of the electro-optic probe according to the first embodiment of the present invention taken along the line VIII-VIII in FIG. 7. The details thereof are the same as those shown in FIG. 8 except for the following details.

Referring to FIG. 9, the lens 53 is not limited to a collimate lens as shown in FIG. 8, and may be a collective lens, for example.

Light transmitted through the optical fiber 16, specifically, linear polarized light in which, for example, a polarization plane conforms to the unique polarization direction D1, that is, a slow axis or a fast axis, of the optical fiber 16 enters the electro-optic crystal 52 while being collected by the lens 53 as shown by dotted lines 92 in FIG. 9, interacts with the detection target electromagnetic wave 36 from the antenna 22, and is reflected by the reflecting unit 51. The reflected light enters the lens 53, is collected, and returns to the optical fiber 16.

Note here that, for ease of description, one unique axis D2 of the electro-optic crystal 52 is shown, but the electro-optic crystal 52 has, for example, a unique axis that is orthogonal to the unique axis D2, that is, a unique axis that extends in the direction of the y axis. Furthermore, for example, the optical fiber 16 also has a unique polarization direction that is orthogonal to the unique polarization direction D1, that is, a unique polarization direction that extends in the direction of the y axis.

Preferably, the electro-optic crystal 52 is a naturally birefringent crystal. Specifically, the electro-optic crystal 52 is, for example, an inorganic crystal that is naturally birefringent, such as LiTaO3 (lithium tantalate), LiNbO3 (lithium niobate), BaTaO3 (barium titanate), SBN (barium strontium niobate), and ZGP (zinc phosphide germanium).

Alternatively, the electro-optic crystal 52 may be an organic nonlinear optical crystal that is naturally birefringent, such as DAST (4-N,N-dimethylamino-4'-N'-methyl-stilbazolium tosylate), DASC (4-N,N-dimethylamino4'-N'-methyl-stilbazolium-para-chlorobenzenesulfonate), DSTMS (4-N,N-dimethylamino-4'-N'-methyl-stilbazolium2,4,6-trimethyl toluenesulfonate), and OH1 (2-(3-(4-hydroxystyryl)-5,5-dimethylcydohex-2-enylidene)malononitrile), for example.

Note that the electro-optic crystal 52 may be an inorganic crystal that is not naturally birefringent, such as GaP (gallium phosphide), GaAs (gallium arsenide), InP (indium phosphide), ZnTe (zinc telluride), and CdTe (cadmium telluride), for example, or may be an organic crystal that is not naturally birefringent.

Figure 10:
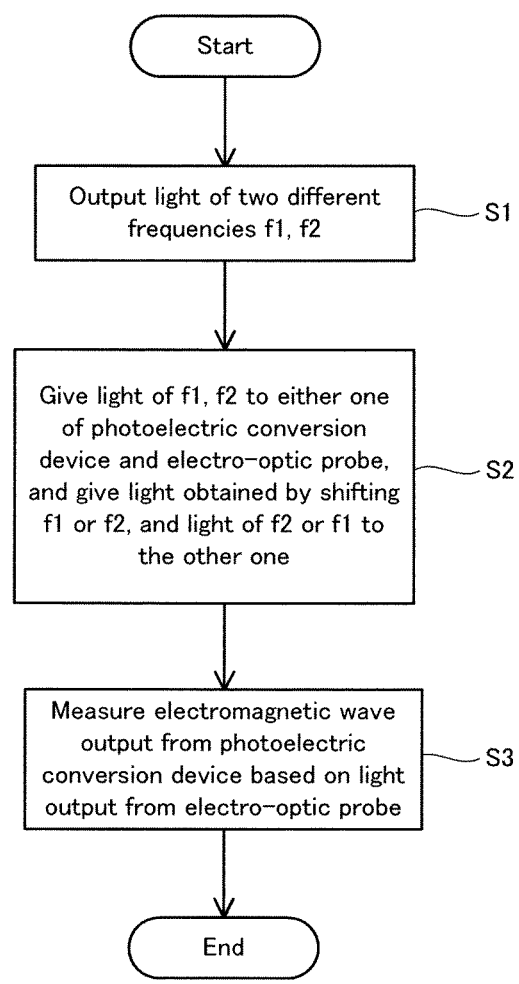
FIG. 10 is a diagram illustrating a procedure of an electromagnetic wave measuring method using the electromagnetic wave measuring apparatus according to the first embodiment of the present invention.

FIG. 10 is a diagram illustrating a procedure of an electromagnetic wave measuring method using the electromagnetic wave measuring apparatus according to the first embodiment of the present invention.

Referring to FIG. 10, first, the light emitting elements 1 and 2 are respectively used to output light of two different types of frequencies f1 and f2 (step S1).

Then, the light from the light emitting element 1 and the light from the light emitting element 2 that emits light at a frequency different from that of the light emitting element 1 are provided to the electro-optic probe 101, and a detection target electromagnetic wave 36 that has a frequency equal to the difference between either one of the frequencies of the light emitted from the light emitting element 1 and the light emitting element 2, and a frequency that is obtained by shifting the other one of the frequencies of the light from the light emitting element 1 and the light emitting element 2 is radiated to the electro-optic probe 101. Alternatively, the light from either one of the light emitting element 1 and the light emitting element 2, and light obtained by shifting the frequency of the light from the other one of the light emitting element 1 and the light emitting element 2 are provided to the electro-optic probe 101, and a detection target electromagnetic wave 36 of a frequency equal to the difference between the frequency of the light from the light emitting element 1 and the frequency of the light from the light emitting element 2 is radiated to the electro-optic probe 101.

Specifically, the types of light of the frequencies f1 and f2 are provided to one of the photoelectric conversion device 21 and the electro-optic probe 101, and light obtained by shifting either one of the frequencies f1 and f2, and other light are provided to the other one of the photoelectric conversion device 21 and the electro-optic probe 101. Then, a detection target electromagnetic wave 36 having a frequency equal to the difference between the two frequencies of the types of light provided to the photoelectric conversion device 21 is radiated via the antenna 22 (step S2).

Then, the detection target electromagnetic wave 36 is measured based on light emitted from the electro-optic probe 101. Specifically, the detection target electromagnetic wave 36 output from the photoelectric conversion device 21 via the antenna 22 is measured based on light output from the electro-optic probe 101 via the optical fiber 16 (step S3).

Here, the applicants of the present application conducted the following test using the electromagnetic wave measuring apparatus 201.

Figure 11:
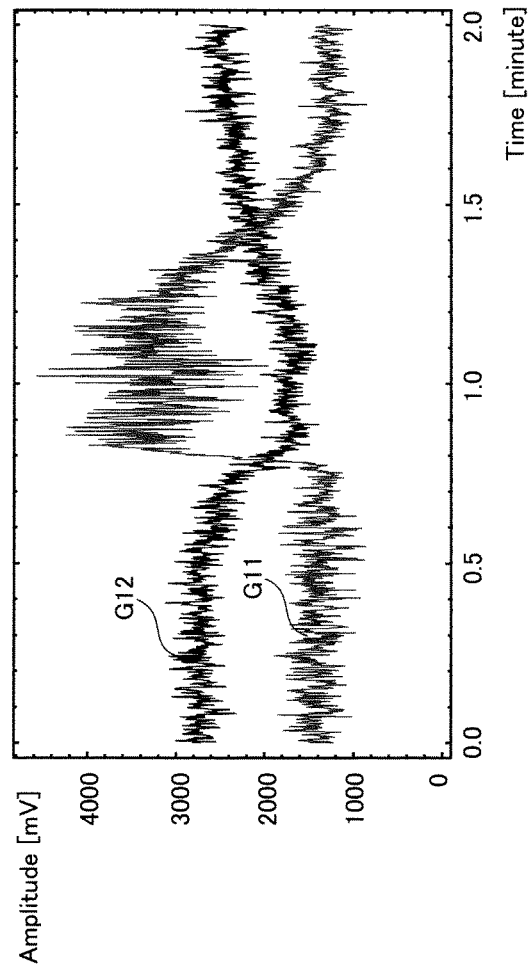
FIG. 11 is a diagram illustrating an example of results of measurement conducted by the electromagnetic wave measuring apparatus according to the first embodiment of the present invention, and an apparatus of a comparative example 1.
Figure 12:
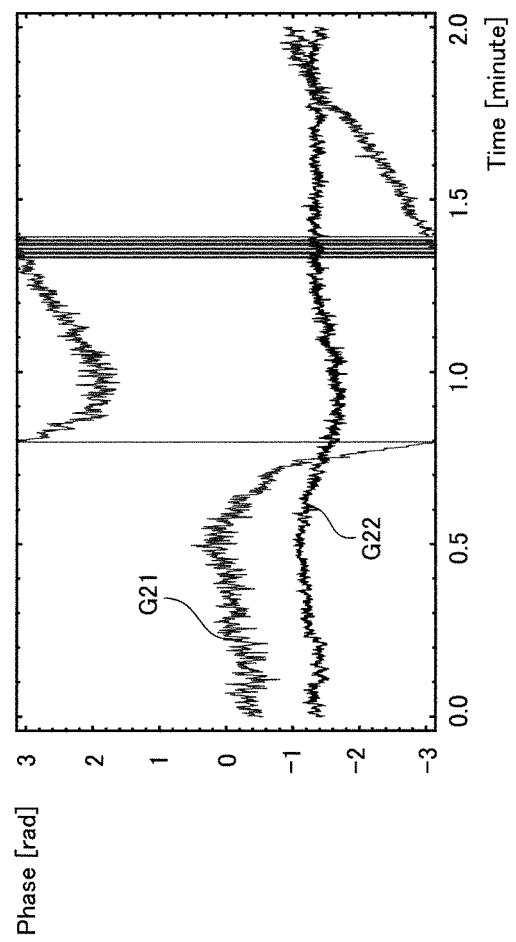
FIG. 12 is a diagram illustrating an example of results of measurement conducted by the electromagnetic wave measuring apparatus according to the first embodiment of the present invention, and the apparatus of the comparative example 1.

FIGS. 11 and 12 are diagrams illustrating an example of results of measurement conducted by the electromagnetic wave measuring apparatus according to the first embodiment of the present invention and an electromagnetic wave measuring apparatus according to a comparative example 1. FIGS. 11 and 12 are construed in the same manner as in FIGS. 5 and 6.

In FIG. 11, a graph G11 denotes amplitudes of the apparatus of the comparative example 1 of the electromagnetic wave measuring apparatus 201, and a graph G12 denotes amplitudes of the electromagnetic wave measuring apparatus 201. In FIG. 12, a graph G21 denotes phases of the apparatus of the comparative example 1 of the electromagnetic wave measuring apparatus 201, and a graph G22 denotes phases of the electromagnetic wave measuring apparatus 201.

In the measurement, as the electromagnetic wave measuring apparatus 201, an electromagnetic wave measuring apparatus was used in which the angle between the direction of a unique axis of an electro-optic crystal of an electro-optic probe 101 and the polarization direction of light from an optical fiber 16 that enters the electro-optic crystal was set to about 0 degrees. Furthermore, a lock-in amplifier that has a lock-in frequency of 100 kHz, and has a lock-in time constant of 30 ms was used as the amplitude/phase detector 15.

Furthermore, in the measurement, DAST, which is an organic nonlinear optical crystal, was used as the electro-optic crystal, and the electro-optic probes 101 of the electromagnetic wave measuring apparatus 201 and the measuring apparatus according to the comparative example 1 are arranged side by side, and the electric field of the detection target electromagnetic wave 36 of 0.310 THz was measured for 2 minutes. Then, on the assumption that the electromagnetic wave measuring apparatuses will be used in a non-laboratory environment such as outdoors, the temperature around the electro-optic probes 101 was changed by a few degrees during the measurement period. FIGS. 5 and 6 explained above are diagrams illustrating only the results of measurement conducted in the comparative example 1. That is, the graphs G11 and G21 of FIGS. 11 and 12 are identical to the graphs G11 and G21 of FIGS. 5 and 6.

Referring to FIGS. 11 and 12, the graphs G12 and G22 show that the amplitude and phase of the electric field of 0.310 THz in a space between the antenna 22 and the electro-optic probe 101 of the electromagnetic wave measuring apparatus 201 barely varied with time, and it was confirmed that the detection sensitivity of the electro-optic probe 101 was stable.

Specifically, the amplitude is in a range between about 1400 mV and about 3200 mV, and the phase is in a range between about −1.7 radian and about −1.0 radian, and thus it was clear that a noticeable improvement in performance was achieved in the stability of the amplitude detection and the phase detection relative to the comparative example 1.

Furthermore, in a situation where the temperature around the electro-optic probes 101 was not controlled to change during the measurement period, the S/N ratios were obtained based on output signals of the amplitude/phase detectors 15 of the electromagnetic wave measuring apparatus 201 and the apparatus according to the comparative example 1, and comparison therebetween was performed. Results showed that the S/N ratio of the electromagnetic wave measuring apparatus 201 is larger than that of the comparative example 1 by 3 dB. Accordingly, the sensitivity of the electromagnetic wave measuring apparatus 201 was improved relative to the comparative example 1 by 3 dB, and the power of an electromagnetic wave to be measured was drastically reduced with an increase in frequency, for example, from a millimeter wave to a terahertz wave, and thus the improvement in the sensitivity by 3 dB can be regarded as a noticeable advancement in such a frequency band.

Figure 13:
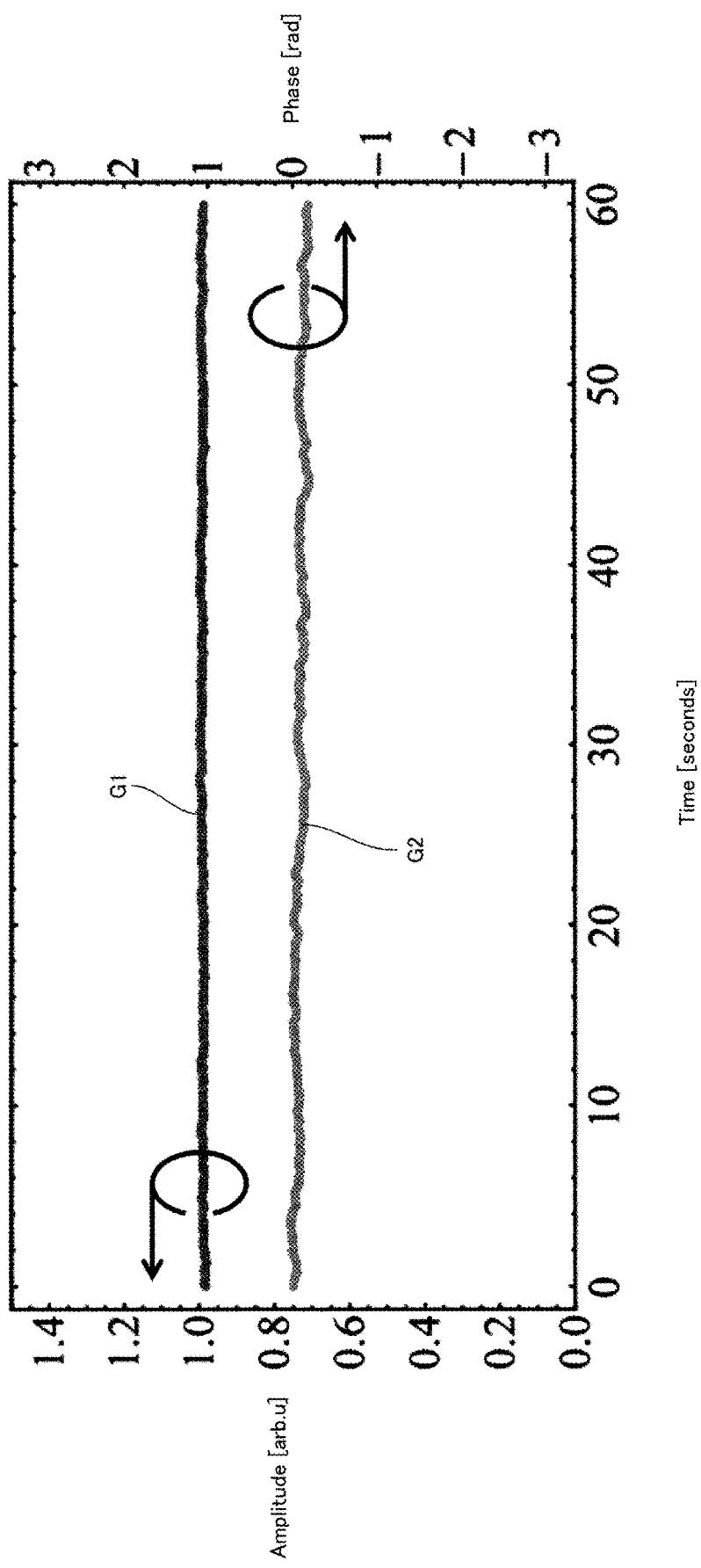
FIG. 13 is a diagram illustrating an example of a result of measurement conducted by the electromagnetic wave measuring apparatus according to the first embodiment of the present invention.

FIG. 13 is a diagram illustrating an example of results of measurement conducted by the electromagnetic wave measuring apparatus according to the first embodiment of the present invention. FIG. 13 illustrates the measurement results of the electric field of the detection target electromagnetic wave 36 of 0.1249995 THz.

In FIG. 13, the vertical axes denote amplitudes [arb.u.] and phases [rad], and the horizontal axis denotes time [seconds]. The amplitudes of the vertical axis are indicated with normalized values. A graph G1 denotes the amplitude, and a graph G2 denotes the phase.

In the measurement, DAST, which is an organic nonlinear optical crystal, was used as the electro-optic crystal 52, and the electric field of the detection target electromagnetic wave 36 of 0.1249995 THz was measured for 60 seconds. Note that in the measurement, the temperature around the electro-optic probe 101 was not controlled to change during the measurement period.

Referring to FIG. 13, it was confirmed, based on the graphs G1 and G2, that the variations with time in the amplitude and phase of the electric field of 0.1249995 THz in a space between the antenna 22 and the electro-optic probe 101 could be measured in real time, that is, in parallel.

Specifically, as a result of the measurement, the amplitude was about 1.0 and thus constant, and the phase was in a range between −0.2 and 0.1 radian, and thus it was recognized that stable results with little variation could be obtained.

Figure 14:
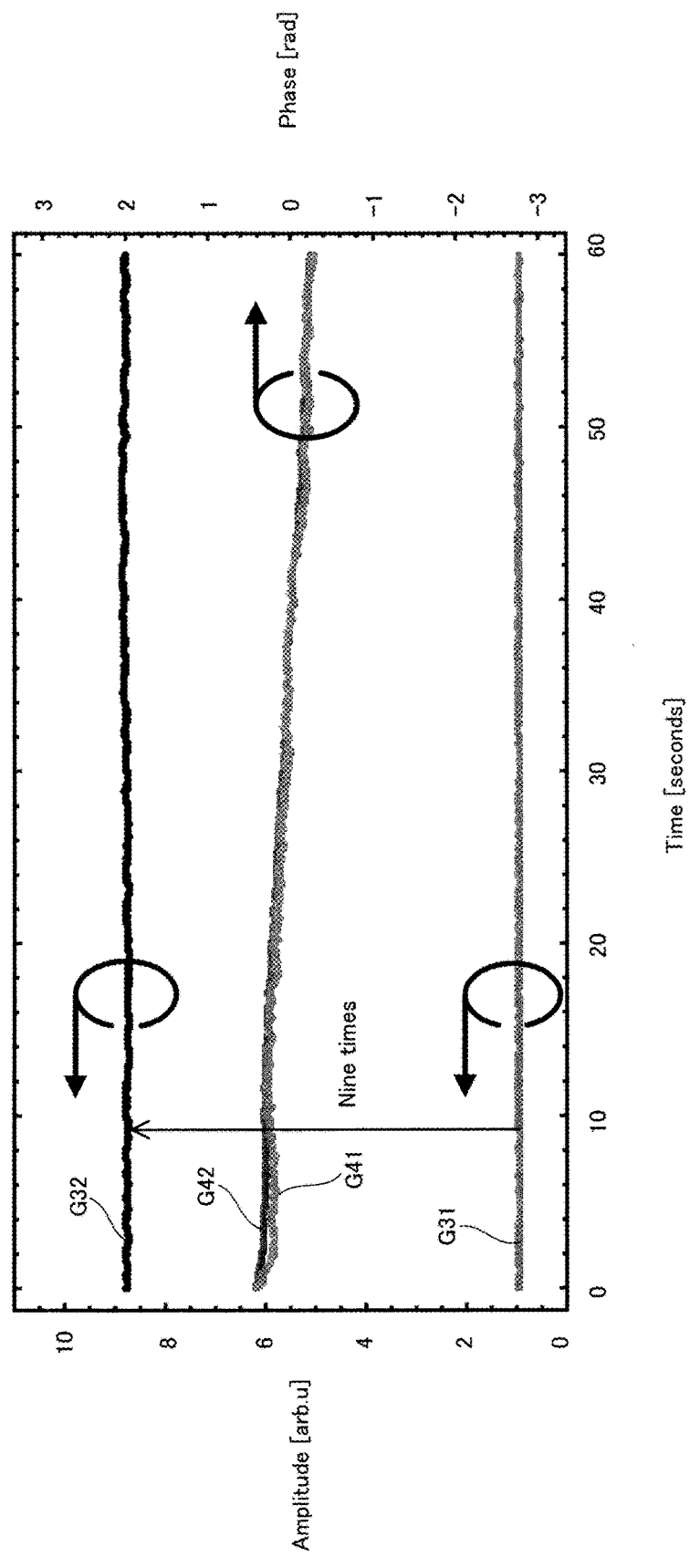
FIG. 14 is a diagram illustrating an example of results of measurement conducted by the electromagnetic wave measuring apparatus according to the first embodiment of the present invention, and an apparatus of a comparative example 2.

FIG. 14 is a diagram illustrating an example of results of measurement conducted by the electromagnetic wave measuring apparatus according to the first embodiment of the present invention, and an apparatus of a comparative example 2.

In FIG. 14, the vertical axes denote amplitudes [arb.u.] and phases [rad], and the horizontal axis denotes time [seconds]. The amplitudes of the vertical axis are indicated with normalized values.

Furthermore, a graph G31 denotes the amplitude of the apparatus of the comparative example 2 of the electromagnetic wave measuring apparatus 201, a graph G32 denotes the amplitude of the electromagnetic wave measuring apparatus 201, a graph G41 denotes the phase of the apparatus of the comparative example 2 of the electromagnetic wave measuring apparatus 201, and a graph G42 denotes the phase of the electromagnetic wave measuring apparatus 201.

In the measurement, DAST was used as the electro-optic crystal 52 of the electromagnetic wave measuring apparatus 201. Furthermore, as the apparatus of the comparative example 2 of the electromagnetic wave measuring apparatus 201, an electromagnetic wave measuring apparatus was used in which ZnTe (zinc telluride) was used as electro-optic crystal, and the angle between the direction of a unique axis of the electro-optic crystal of an electro-optic probe 101 and the polarization direction of light from an optical fiber 16 that enters the electro-optic crystal was set to about 45 degrees as in the technology disclosed in Patent Document 1. Here, the unique axis of the electro-optic crystal in the comparative example 2 is a principal axis of ZnTe to which an electric field is applied. Furthermore, a lock-in amplifier that has a lock-in frequency of 100 kHz, and has a lock-in time constant of 30 ms was used as the amplitude/phase detector 15.

In the measurement, the electric field of the detection target electromagnetic wave 36 of 0.1249995 THz was measured for 60 seconds. Note that in the measurement, the temperature around the electro-optic probe 101 was not controlled to change during the measurement period.

Referring to the graphs G41 and G42, the detection characteristics for the phases of the apparatus of the comparative example 2 and the electromagnetic wave measuring apparatus 201 are substantially the same.

On the other hand, referring to the graphs G31 and G32, the amplitude in the comparative example 2 is about 1.0, and the amplitude of the electromagnetic wave measuring apparatus 201 is about 9.0. That is, it was clear that, in the electromagnetic wave measuring apparatus 201, the measurement stability was noticeably improved, and as a result of DAST, which is naturally birefringent and has a large electro-optic effect, being available, the amplitude detection sensitivity was improved about nine times higher than that in the comparative example 2. The improvement corresponds to an improvement of 19 dB in terms of the S/N ratio.

Note that the optical fiber 16 is not limited to a polarization maintaining fiber, and may be, for example, a single mode fiber or a multiple mode fiber. In this case, a single mode fiber or a multiple mode fiber is preferably fixed at a position using any fixation member or the like, so that the polarization direction, that is, polarization plane, of light is stabilized.

Furthermore, the electromagnetic wave measuring apparatus according to the first embodiment of the present invention employs, similar to the technology disclosed in Patent Document 3, a so-called self-heterodyne technique using the optical shifter 9, but the present invention is not limited to this. The electromagnetic wave measuring apparatus may employ another method such as a homodyne technique.

Furthermore, the electromagnetic wave measuring apparatus according to the first embodiment of the present invention is configured such that two types of probe light are provided to the electro-optic probe 101, but the present invention is not limited to this, and a configuration is also possible in which three or more types of light are provided to the electro-optic probe 101. Furthermore, the electro-optic probe 101 may be used in an electromagnetic wave measuring apparatus in which one type of probe light is provided.

Furthermore, the electromagnetic wave measuring apparatus according to the first embodiment of the present invention is configured such that the direction of the unique axis D2 of the electro-optic crystal 52 and the unique polarization direction D1 of the optical fiber 16 are set so as to be in line with each other, but the present invention is not limited to this. It is sufficient that the electromagnetic wave measuring apparatus has a configuration in which the polarization direction of light from the optical fiber 16 that enters the electro-optic crystal 52 is in line with the direction of the unique axis D2 of the electro-optic crystal 52, and, for example, a configuration is also possible in which the unique polarization direction of the optical fiber 16 is not in line with the direction of the unique axis D2 of the electro-optic crystal 52 and a polarization controlling element for controlling the polarization direction of probe light from the optical fiber 16 to be in line with the direction of the unique axis D2 of the electro-optic crystal 52 is provided between the optical fiber 16 and the electro-optic crystal 52.

Furthermore, the configuration in which the polarization direction of light from the optical fiber 16 that enters the electro-optic crystal 52 is in line with the direction of the unique axis D2 of the electro-optic crystal 52 corresponds to, for example, a configuration in which the detection sensitivity is ½ or more of the peak value, and preferably corresponds to a configuration in which the detection sensitivity is ¾ or more of the peak value. As an example, a configuration in which the peak value of the detection sensitivity can be achieved means a configuration in which the polarization direction of light from the optical fiber 16 that enters the electro-optic crystal 52 conforms to the direction of the unique axis D2 of the electro-optic crystal 52.

Meanwhile, technology with which it is possible to measure an electromagnetic wave more suitably than the technologies disclosed in Patent Documents 1 to 3 is in demand.

Specifically, for example, in the technology disclosed in Patent Document 1, the polarization plane of linear polarized light is inclined at about 45 degrees with respect to either one of two electric principal axes of an electro-optic crystal, and thus, if a naturally birefringent electro-optic crystal that has the maximum electro-optic effect in an electric principal axis is used for example, then the electricity/light conversion efficiency is reduced in accordance with the inclination angle, and the detection sensitivity deteriorates.

Furthermore, for example, the technology disclosed in Patent Document 2 is an electric field measuring method to which polarization modulation of probe light is applied, and if, for example, a naturally birefringent electro-optic crystal is used, then fluctuation caused by, for example, disturbance in the naturally birefringent properties of the electro-optic crystal itself directly affects fluctuations in the detection sensitivity, and thus the measurement stability deteriorates. Furthermore, variation in a polarized wave propagating in the optical fiber also induces variation in the detection sensitivity, thus deteriorating the measurement stability. In order to avoid polarization modulation resulting from such disturbances, it is necessary to provide a separate polarization stabilizing system, which results in a complex and expensive measurement system.

In contrast, in the electro-optic probe according to the first embodiment of the present invention, the optical fiber 16 is optically coupled to the electro-optic crystal 52. Also, the polarization direction of light from the optical fiber 16 that enters the electro-optic crystal 52 is set to be in line with the direction of a unique axis of the electro-optic crystal 52.

With such a configuration, it is possible to align the polarization direction of probe light that enters the electro-optic crystal 52 with the unique axis D2 of the electro-optic crystal 52 that above all has a large electro-optic effect. Also, with a configuration in which the probe light whose polarization direction is in line with the direction of the unique axis D2 is used, and the detection target electromagnetic wave 36 and the probe light interact with each other in the electro-optic crystal 52, it is possible, for example, to maximize the detection sensitivity due to a large electro-optic effect, that is, to realize highly-sensitive electric field measurement.

Accordingly, in the electro-optic probe according to the first embodiment of the present invention, it is possible to suitably measure an electromagnetic wave using an electro-optic crystal.

Furthermore, in the electro-optic probe according to the first embodiment of the present invention, the electro-optic crystal 52 is naturally birefringent.

With a configuration using an electro-optic crystal 52 that is naturally birefringent, and for which there are many types with a large electro-optic constant, it is possible to further improve the detection sensitivity while achieving an effect of improving the measurement stability by eliminating the adverse effects of birefringence.

Furthermore, in the technologies disclosed in Patent Documents 1 and 2, the polarization state of probe light largely varies due to fluctuations in the natural birefringence due to temperature or the like, and the variation largely affects fluctuations in the detection sensitivity.

In contrast, with a configuration that is not based on the measurement principle of electric field measurement using polarization modulation, and in which, specifically, the polarization direction of probe light that enters the electro-optic crystal 52 is aligned with the unique axis D2 of the electro-optic crystal 52, a change in the modulation efficiency due to the fluctuations in temperature is significantly small, and thus it is possible to realize a state in which measurement is unlikely to be affected by the disturbance, making it possible to stably measure the amplitude and phase of the detection target electromagnetic wave 36.

Furthermore, in the electro-optic probe according to the first embodiment of the present invention, the electro-optic crystal 52 is an organic nonlinear optical crystal.

Accordingly, with a configuration in which, for example, an organic nonlinear optical crystal, which can often achieve a larger electro-optic effect than an inorganic optical crystal, is used as the electro-optic crystal 52, it is possible to further improve the detection sensitivity.

Furthermore, in the electro-optic probe according to the first embodiment of the present invention, the electro-optic crystal 52 is DAST, DASC, DSTMS, or OH1.

Accordingly, with a configuration in which an organic nonlinear optical crystal, which has a particularly large electro-optic constant, is used as the electro-optic crystal 52, it is possible to significantly improve the detection sensitivity, while suppressing fluctuations in the natural birefringence ratio by aligning the polarization direction of probe light that enters the electro-optic crystal 52 with the unique axis D2 of the electro-optic crystal 52.

Furthermore, in the electro-optic probe according to the first embodiment of the present invention, the optical fiber 16 is a polarization maintaining fiber. Also, the direction of a unique axis of the electro-optic crystal 52 and the unique polarization direction of the optical fiber 16 are set to be in line with each other.

With such a configuration, it is possible to suppress disturbance in the polarization direction of light propagating in the optical fiber 16, and it is also possible to align the unique polarization direction D1 of the optical fiber 16 with the unique axis D2 of the electro-optic crystal 52 more reliably and easily. Furthermore, with a configuration in which the polarization direction of light is controlled in the optical fiber 16, it is no longer necessary to provide a polarization controlling element for controlling the polarization direction of the probe light from the optical fiber 16 so as to be in line with the direction of a unique axis of the electro-optic crystal 52, or the like between the optical fiber 16 and the electro-optic crystal 52.

Furthermore, in the electromagnetic wave measuring apparatus according to the first embodiment of the present invention, the light emitting element 2 emits light at a frequency different from that of the light emitting element 1. The electro-optic probe 101 receives the light from the light emitting element 1 and the light from the light emitting element 2. The optical electromagnetic wave conversion unit 10 receives the light from the light emitting element 1 and the light from the light emitting element 2, generates a detection target electromagnetic wave 36 that has a frequency equal to the difference between the frequencies of the received types of light, and emits the generated detection target electromagnetic wave 36 to the electro-optic probe 101. The optical shifter 9 is provided between the light emitting element 1 or the light emitting element 2, and the optical electromagnetic wave conversion unit 10 or the electro-optic probe 101, and is configured to shift the frequency of received light and output the resultant light. Also, in the electro-optic probe 101, the polarization direction of light from the optical fiber 16 that enters the electro-optic crystal 52 is set to be in line with the direction of a unique axis of the electro-optic crystal 52.

With such a configuration, it is possible to align the polarization direction of probe light that enters the electro-optic crystal 52 with the unique axis D2 of the electro-optic crystal 52 that above all has a large electro-optic constant. Also, with a configuration in which the probe light whose polarization direction is in line with the direction of the unique axis D2 is used, and the detection target electromagnetic wave 36 and the probe light interact with each other in the electro-optic crystal 52, it is possible, for example, to maximize the detection sensitivity using the large electro-optic constant, that is, to realize highly-sensitive electric field measurement.

Therefore, in the electromagnetic wave measuring apparatus according to the first embodiment of the present invention, it is possible to suitably measure an electromagnetic wave using an electro-optic crystal.

Furthermore, with a configuration in which a frequency shifter, that is, the optical shifter 9 shifts the frequency of light output from at least one light source, and types of probe light of at least two different frequencies enter the electro-optic crystal 52, it is possible to measure, in real time, phase information, which needs to be measured at two positions or more in a configuration in which no frequency is shifted or one type of probe light enters the electro-optic crystal 52.

More specifically, with a configuration in which the frequency of light emitted from at least one light source is shifted by the optical shifter 9, there can be a frequency difference between the frequency of an electromagnetic wave generated by the optical electromagnetic wave conversion unit 10, and the frequency difference between the two different frequencies of light that enters the electro-optic probe 101, and it is possible to acquire pieces of information regarding the amplitude and phase at the same time. Note that if there is no frequency difference, that is, if the optical shifter 9 is not used, the amplitude and phase cannot be determined at the same time, and at least two measurement values are needed.

Furthermore, in the electromagnetic wave measuring method according to the first embodiment of the present invention, first, light from the light emitting element 1 and light from the light emitting element 2 that emits light at a frequency different from that of the light emitting element 1 are provided to the electro-optic probe 101, and a detection target electromagnetic wave 36 that has a frequency equal to the difference between either one of the frequencies of the light emitting element 1 and the light emitting element 2, and a frequency obtained by shifting the other one of the frequencies of the light emitting element 1 and the light emitting element 2 is radiated to the electro-optic probe 101, or the light from either one of the light emitting element 1 and the light emitting element 2, and light obtained by shifting the frequency of the light from the other one of the light emitting element 1 and the light emitting element 2 are provided to the electro-optic probe 101, and a detection target electromagnetic wave 36 that has a frequency equal to the difference between the frequency of the light emitting element 1 and the frequency of the light emitting element 2 is radiated to the electro-optic probe 101. Then, the detection target electromagnetic wave 36 is measured based on light output from the electro-optic probe 101. Here, in the electro-optic probe 101, the polarization direction of light from the optical fiber 16 that enters the electro-optic crystal 52 is set to be in line with the direction of a unique axis of the electro-optic crystal 52.

Accordingly, it is possible to align the polarization direction of probe light that enters the electro-optic crystal 52 with the unique axis D2 of the electro-optic crystal 52 that above all has a large electro-optic constant. Also, with a configuration in which the probe light whose polarization direction is in line with the direction of the unique axis D2 is used, and the detection target electromagnetic wave 36 and the probe light interact with each other in the electro-optic crystal 52, it is possible, for example, to maximize the detection sensitivity using the large electro-optic constant, that is, to realize highly-sensitive electric field measurement.

Accordingly, in the electromagnetic wave measuring method according to the first embodiment of the present invention, it is possible to suitably measure an electromagnetic wave using an electro-optic crystal.

Furthermore, with a configuration in which a frequency shifter, that is, the optical shifter 9, shifts the frequency of light output from at least one light source, and types of probe light of at least two different frequencies enter the electro-optic crystal 52, it is possible to measure, in real time, phase information, which needs to be measured at two positions or more in a configuration in which no frequency is shifted or one type of probe light enters the electro-optic crystal 52.

More specifically, with a configuration in which the frequency of light emitted from at least one light source is shifted by the optical shifter 9, there can be a frequency difference between the frequency of an electromagnetic wave generated by the optical electromagnetic wave conversion unit 10, and the frequency difference between the two different frequencies of light that enters the electro-optic probe 101, and it is possible to acquire pieces of information regarding the amplitude and phase at the same time. Note that if there is no frequency difference, that is, if the optical shifter 9 is not used, the amplitude and phase cannot be determined at the same time, and at least two measurement values are required.

The following will describe another embodiment of the present invention with reference to the drawings. Note that, in the drawings, the same reference numerals are given to the same or corresponding components in the drawings, and redundant descriptions thereof are not repeated.

Second Embodiment

The present embodiment relates to an electromagnetic wave measuring apparatus that employs a principle different from the self-heterodyne principle of the electromagnetic wave measuring apparatus according to the first embodiment. The details thereof are the same as those of the electromagnetic wave measuring apparatus according to the first embodiment except for the following items.

Figure 15:
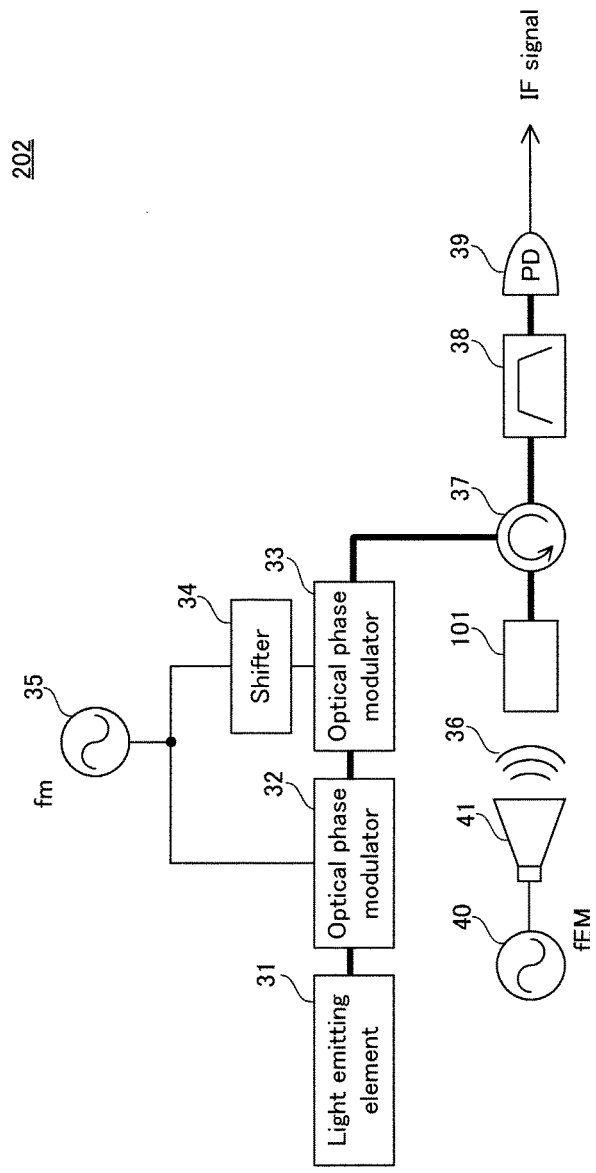
FIG. 15 is a diagram illustrating a configuration of an electromagnetic wave measuring apparatus according to a second embodiment of the present invention.

FIG. 15 is a diagram illustrating a configuration of the electromagnetic wave measuring apparatus according to the second embodiment of the present invention.

Referring to FIG. 15, an electromagnetic wave measuring apparatus 202 is provided with an electro-optic probe 101, a light emitting element (light source) 31, optical phase modulators 32 and 33, a shifter 34, an oscillator 35, a circulator 37, an optical wavelength filter 38, and a light receiving element (PD) 39.

In contrast to the electromagnetic wave measuring apparatus 201, the electromagnetic wave measuring apparatus 202 performs asynchronous measurement in which a detection target electromagnetic wave 36 and probe light are not synchronized with each other. For example, a detection target electromagnetic wave 36 of a frequency fEM is generated by an oscillator 40, and is radiated to the electro-optic probe 101 via an antenna 41 such as a horn antenna.

The optical phase modulator 32 subjects a seed light received from the light emitting element 31 to phase modulation based on an oscillation signal of a frequency fm received from the oscillator 35, and outputs the resultant light.

The shifter 34 shifts the phase of the oscillation signal received from the oscillator 35, and outputs the resultant signal to the optical phase modulator 33.

The optical phase modulator 33 subjects the light received from the optical phase modulator 32 to phase modulation based on the oscillation signal received from the shifter 34, and outputs the resultant light.

The light transmitted from the optical phase modulator 33 to the electro-optic probe 101 via the circulator 37 interacts with the detection target electromagnetic wave 36 at the electro-optic probe 101, is reflected and output to the circulator 37, and then is output from the circulator 37 to the optical wavelength filter 38.

Figure 16:
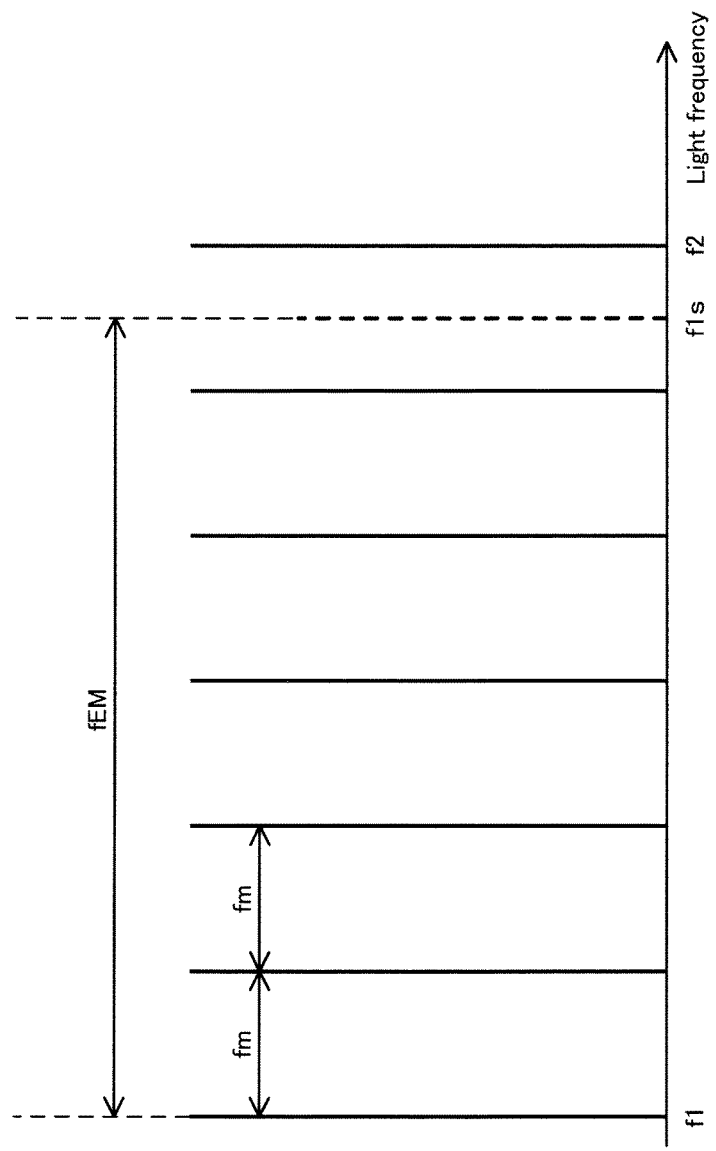
FIG. 16 is a diagram illustrating an example of a sideband modulated with probe light and an electro-optic crystal in the electromagnetic wave measuring apparatus according to the second embodiment of the present invention.

FIG. 16 is a diagram illustrating an example of a modulated sideband with probe light and an electro-optic crystal of the electromagnetic wave measuring apparatus according to the second embodiment of the present invention.

Referring to FIG. 16, an optical frequency comb, specifically, a modulated sideband group constituted by types of single-frequency light arranged at frequency fm intervals is output as probe light from the optical phase modulator 33 to the circulator 37.

The circulator 37 receives such an optical frequency comb from the optical phase modulator 33, and outputs the received optical frequency comb to the electro-optic probe 101.

In the electro-optic probe 101, due to the interaction between the detection target electromagnetic wave 36 having the frequency fEM and components of the optical frequency comb from the circulator 37, a new sideband component is generated for each of the components. Note that FIG. 16 only shows a component of a frequency f1s=(f1+fEM), which is a notable type of sideband light.

The optical wavelength filter 38 dampens the component of the frequency components of the light received from the circulator 37 that is outside a predetermined frequency band, for example. More specifically, the optical wavelength filter 38 is, for example, a bandpass filter that selects, from light received from the circulator 37, a type of sideband light generated in the electro-optic probe 101, and a suitable component of the optical frequency comb received by the circulator 37. Here, the optical wavelength filter 38 is assumed to output light of a frequency (f1+fEM) and light of a frequency f2. Note here that the relationship fEM≠f2−f1 is met.

The light receiving element 39 converts the light having passed through the optical wavelength filter 38 into an electric signal, and outputs the converted electric signal to a not-shown detector such as a lock-in amplifier.

Figure 17:
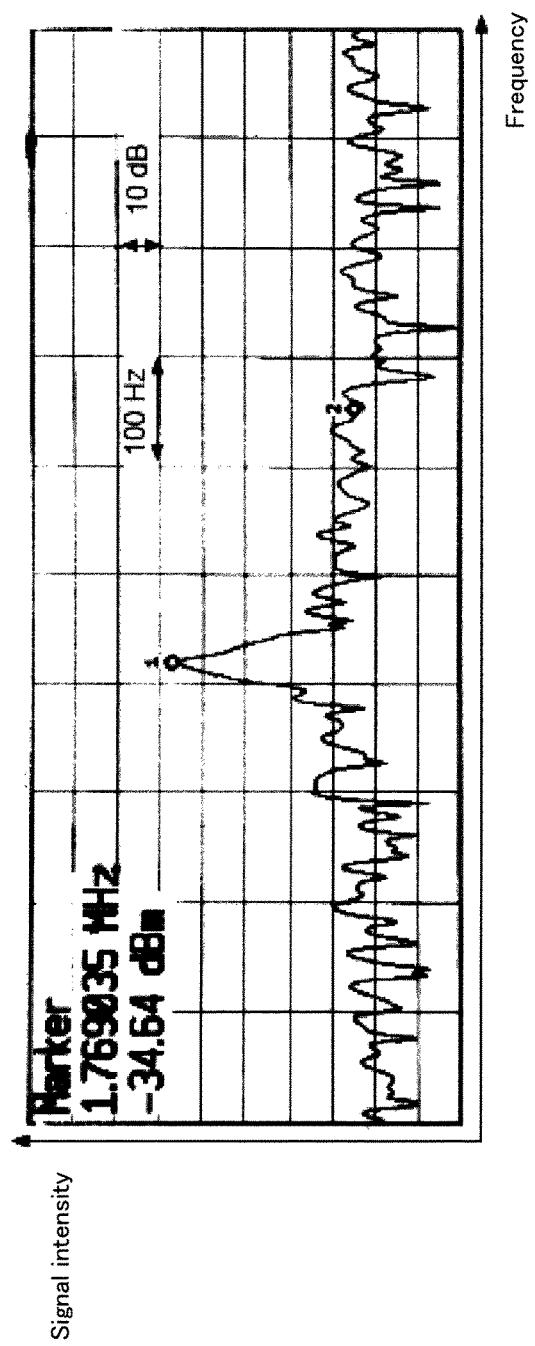
FIG. 17 is a diagram illustrating an example of a result of measurement conducted by the electromagnetic wave measuring apparatus according to the second embodiment of the present invention.

FIG. 17 is a diagram illustrating an example of a result of measurement conducted by the electromagnetic wave measuring apparatus according to the second embodiment of the present invention. FIG. 17 shows the measurement result of a signal output from the light receiving element 39 measured using a spectrum analyzer.

In FIG. 17, the vertical axis denotes signal intensity in which one scale-block indicates 10 dB. The horizontal axis denotes frequencies in which one scale-block indicates 100 Hz.

In the measurement, the wavelength of a seed light output from the light emitting element 31 was set to 1550 nm, the frequency fm of an oscillation signal output from the oscillator 35 was set to 12.6 GHz, and the frequency fEM of the detection target electromagnetic wave 36 was set to 75.60177 GHz.

In other words, as shown in FIG. 16, fEM<(f2−f1)=6×fm was set. In this case, 12.6 GHz×6−75.60177 GHz=1.77 MHz is given as the difference in frequency components between the light of the frequency f1s=(f1+fEM), which is a type of sideband light generated in the electro-optic probe 101, and the light of the frequency f2 of the optical frequency comb received by the circulator 37.

An IF signal output from the light receiving element 39, that is, an electric signal in an IF band that is obtained as a result of heterodyne detection between the light of the frequency f1s and the light of the frequency f2 contains information regarding the amplitude and phase of the detection target electromagnetic wave 36.

Referring to FIG. 17, components of the frequency 1.769035 MHz and the amplitude −34.64 dBm of a signal output from the light receiving element 39 were obtained as a marker 1, and it was recognized that an electromagnetic wave of 75.60177 GHz could be measured using the electromagnetic wave measuring apparatus 202 in a highly sensitive and stable manner.

Note that the electromagnetic wave measuring apparatus 202 is configured to use two optical phase modulators to generate an optical frequency comb, but the present invention is not limited to this, and it is also possible to employ a configuration such as a configuration in which a mode-locked laser is used, a configuration in which a phase modulator and an intensity modulator are used, a configuration in which one phase modulator is used, or a configuration in which one intensity modulator is used.

Furthermore, the electromagnetic wave measuring apparatus 202 is configured to generate an optical frequency comb, but the present invention is not limited to this. For example, a configuration is also possible in which two light sources for generating respective types of light of the frequencies f1 and f2 asynchronously are used.

Other configurations and operations are the same as those of the electromagnetic wave measuring apparatus according to the first embodiment, and thus detailed descriptions thereof are not repeated here.

Note that the electromagnetic wave measuring apparatuses according to the first embodiment and the second embodiment of the present invention are configured to use light of a plurality of frequencies as probe light, but the present invention is not limited to this. The electro-optic probe 101 may also be applied to an electromagnetic wave measuring apparatus that uses light of one frequency as probe light.

Furthermore, the detectors of the electromagnetic wave measuring apparatus according to the first embodiment of the present invention and the electromagnetic wave measuring apparatus according to the second embodiment of the present invention are configured to measure the amplitude and phase of a detection target electromagnetic wave 36, but the present invention is not limited to this. The detectors may be configured to measure either of the amplitude and phase of a detection target electromagnetic wave 36. Furthermore, the detectors may be configured to measure, for example, the frequency of the detection target electromagnetic wave 36, namely as an example, frequency fluctuation. Specifically, the detectors may be, for example, spectrum analyzers, oscilloscopes, frequency counters, or personal computers.

Furthermore, the electromagnetic wave measuring apparatus according to the first embodiment of the present invention is configured to include the detector for measuring a detection target electromagnetic wave 36, but the present invention is not limited to this, and a configuration is also possible in which no detector is provided but an external detector is used. In other words, electric signals output by the light receiving elements 14 and 39 indicate the results of measurement of the detection target electromagnetic wave 36 conducted by the electromagnetic wave measuring apparatuses 201 and 202.

Furthermore, the electromagnetic wave measuring apparatus according to the first embodiment of the present invention and the electromagnetic wave measuring apparatus according to the second embodiment of the present invention are configured such that a detection target electromagnetic wave 36 is radiated to the electro-optic probe 101, but the present invention is not limited to this. It is sufficient for the electromagnetic wave measuring apparatuses to have a configuration in which a detection target electromagnetic wave 36 is provided to the electro-optic probe 101. For example, a configuration is also possible in which the electro-optic probe 101 is arranged in a space in which an electromagnetic wave is generated so that the detection target electromagnetic wave 36 is provided to the electro-optic probe 101.

As described above, in the electromagnetic wave measuring apparatuses according to the first embodiment and the second embodiment of the present invention, the electro-optic probe 101 receives light from the light source, and a detection target electromagnetic wave 36. The optical wavelength filter receives light output from the electro-optic probe 101. The light receiving element converts light that has passed through the optical wavelength filter into an electric signal.

With such a configuration, it is possible to align the polarization direction of probe light that enters the electro-optic crystal 52 with the unique axis D2 of the electro-optic crystal 52 that above all has a large electro-optic constant. Also, with a configuration in which the probe light whose polarization direction is aligned with the direction of the unique axis D2 is used, and the detection target electromagnetic wave 36 and the probe light interact with each other in the electro-optic crystal 52, it is possible, for example, to maximize the detection sensitivity using the large electro-optic constant, that is, to realize highly-sensitive electric field measurement.

Accordingly, in the electromagnetic wave measuring apparatuses according to the first embodiment and the second embodiment of the present invention, it is possible to suitably measure an electromagnetic wave using an electro-optic crystal.

Furthermore, in the electromagnetic wave measuring methods according to the first embodiment and the second embodiment of the present invention, first, light from a light source is provided to the electro-optic probe 101, and a detection target electromagnetic wave 36 is provided to the electro-optic probe 101 via the optical fiber 16. Then, the detection target electromagnetic wave 36 is measured based on light output from the electro-optic probe 101 via the optical fiber 16.

Accordingly, it is possible to align the polarization direction of probe light that enters the electro-optic crystal 52 with the unique axis D2 of the electro-optic crystal 52 that above all has a large electro-optic constant. Also, with a configuration in which the probe light whose polarization direction is aligned with the direction of the unique axis D2 is used, and the detection target electromagnetic wave 36 and the probe light interact with each other in the electro-optic crystal 52, it is possible, for example, to maximize the detection sensitivity using the large electro-optic constant, that is, to realize highly-sensitive electric field measurement.

Accordingly, in the electromagnetic wave measuring methods according to the first embodiment and the second embodiment of the present invention, it is possible to suitably measure an electromagnetic wave using an electro-optic crystal.

Note that the electro-optic probes according to the first embodiment and the second embodiment of the present invention are configured such that the polarization direction of light from the optical fiber 16 that enters the electro-optic crystal 52 is set to be in line with the direction of the unique axis D2 of the electro-optic crystal 52, but the present invention is not limited to this.

The electromagnetic wave measuring apparatus may also have the following configuration. That is, in the electromagnetic wave measuring apparatus 202 shown in FIG. 15, an electro-optic probe 101 in which the direction of the unique axis D2 of the electro-optic crystal 52 and the unique polarization direction D1, such as a slow axis, of the optical fiber 16 are in line with each other is used as an example. Also, the angle between the direction of the unique axis D2 of the electro-optic crystal 52 and the polarization direction of light from the optical fiber 16 that enters the electro-optic crystal 52 is set to, for example, about 45 degrees, and a polarization separation element such as a polarization beam splitter that is connected between the electro-optic probe 101 and the light receiving element 39 is provided. For example, the polarization separation element is connected between the optical wavelength filter 38 and the light receiving element 39, and separates, from light that has passed through the optical wavelength filter 38, a polarization direction component that is in line with the direction of the unique axis D2 of the electro-optic crystal 52, and a polarization direction component orthogonal thereto, and outputs the separated components to the light receiving element 39. Note that the polarization separation element may also be provided upstream of the optical wavelength filter 38.

With such a configuration, for example, even if, in the electromagnetic wave measuring apparatuses and the electromagnetic wave measuring methods according to the embodiments of the present invention, for example, the polarization direction of light from the optical fiber 16 that enters the electro-optic crystal 52 is not in line with the direction of the unique axis D2 of the electro-optic crystal 52, it is possible, for example, to separate and extract the polarization component in the direction of the unique axis D2 of the electro-optic crystal 52, using a polarization separation element or the like. Accordingly, it is possible, for example, to maximize the detection sensitivity due to a large electro-optic effect, that is, to realize highly-sensitive electric field measurement. Accordingly, it is possible to suitably measure an electromagnetic wave using an electro-optic crystal.

The foregoing embodiments are to be construed in all respects as illustrative and not restrictive. The scope of the present invention is defined by the claims rather than the description above, and is intended to include all modifications within the meaning and scope of the claims and equivalents thereof.

DESCRIPTIONS OF REFERENCE NUMERALS 1, 2 Light emitting element (light source)
3, 4 Optical amplifier
5, 6 Optical branching device
7, 8 Optical multiplexer
9 Optical shifter
10 Optical electromagnetic wave conversion unit
11 Oscillator
12 Circulator
13 Optical wavelength filter
14 Light receiving element
15 Amplitude/phase detector
16 Optical fiber
21 Photoelectric conversion device
22 Antenna
31 Light emitting element (light source)
32, 33 Optical phase modulator
34 Shifter
35, 40 Oscillator
37, 61 Circulator
38, 62 Optical wavelength filter
39, 63 Light receiving element
41 Antenna
51 Reflecting unit
52 Electro-optic crystal
53 Lens
101 Electro-optic probe
201, 202 Electromagnetic wave measuring apparatus
D1 Unique polarization direction, unique axis
D2 Unique axis

The invention claimed is:
1. An electro-optic probe for detecting an electromagnetic wave, comprising:
an electro-optic crystal; and
an optical fiber optically coupled to the electro-optic crystal,
wherein a direction of a unique axis of the electro-optic crystal to which an electric field is applied and a polarization direction of light from the optical fiber that enters the electro-optic crystal are set to be substantially parallel to each other.
2. The electro-optic probe according to claim 1, wherein the electro-optic crystal is naturally birefringent.
3. The electro-optic probe according to claim 1, wherein the electro-optic crystal is an organic nonlinear optical crystal.
4. The electro-optic probe according to claim 3, wherein the electro-optic crystal is DAST (4-N,N-dimethylamino-4'-N'-methyl-stilbazolium tosylate), DASC (4-N,N-dimethylamino-4'-N'-methyl-stilbazolium p-chlorobenzenesulfonate), DSTMS (4-N,N-dimethylamino-4'-N'-methyl-stilbazolium 2,4,6-trimethylbenzenesulfonate), or OH1 (2-(3-(4-Hydroxystyryl)-5,5-dimethylcyclohex-2-enylidene)malononitrile).
5. The electro-optic probe according to claim 1, wherein the optical fiber is a polarization maintaining fiber, and a direction of a unique axis of the electro-optic crystal and a unique polarization direction of the optical fiber are set to be in line with each other.
6. An electro-optic probe for detecting an electromagnetic wave, comprising:
an electro-optic crystal; and
an optical fiber optically coupled to the electro-optic crystal,
wherein a direction of a unique axis of the electro-optic crystal to which an electric field is applied and a unique polarization direction of the optical fiber are set to be in the same direction.
7. An electromagnetic wave measuring apparatus comprising:
a light source;
an electro-optic probe configured to receive light from the light source and an electromagnetic wave;
an optical wavelength filter configured to receive light output from the electro-optic probe, and
a light receiving element configured to convert light that has passed through the optical wavelength filter into an electric signal,
wherein the electro-optic probe includes:
an electro-optic crystal; and
an optical fiber optically coupled to the electro-optic crystal,
a direction of a unique axis of the electro-optic crystal to which an electric field is applied and a polarization direction of light from the optical fiber that enters the electro-optic crystal being set to be substantially parallel to each other.
8. An electromagnetic wave measuring apparatus comprising:
a light source;
an electro-optic probe configured to receive light from the light source and an electromagnetic wave;
an optical wavelength filter configured to receive light output from the electro-optic probe, and
a light receiving element configured to convert light that has passed through the optical wavelength filter into an electric signal,
wherein the electro-optic probe includes:
an electro-optic crystal; and
an optical fiber optically coupled to the electro-optic crystal,
a direction of a unique axis of the electro-optic crystal to which an electric field is applied and a unique polarization direction of the optical fiber being set to be in the same direction.

9. An electromagnetic wave measuring method using an electro-optic probe that includes:
   an electro-optic crystal; and
   an optical fiber optically coupled to the electro-optic crystal,
   a direction of a unique axis of the electro-optic crystal to which an electric field is applied and a polarization direction of light from the optical fiber that enters the electro-optic crystal being set to be substantially parallel to each other,
   the method comprising the steps of:
      providing light from a light source to the electro-optic probe and providing an electromagnetic wave to the electro-optic probe; and
      measuring the electromagnetic wave based on light output from the electro-optic probe.

10. An electromagnetic wave measuring method using an electro-optic probe that includes:
   an electro-optic crystal; and
   an optical fiber optically coupled to the electro-optic crystal,
   a direction of a unique axis of the electro-optic crystal to which an electric field is applied and a unique polarization direction of the optical fiber being set to be in the same direction,
   the method comprising the steps of:
      providing light from a light source to the electro-optic probe and providing an electromagnetic wave to the electro-optic probe; and
      measuring the electromagnetic wave based on light output from the electro-optic probe.

11. The electro-optic probe according to claim 1,
   wherein the unique axis of the electro-optic crystal is the axis of a plurality of unique axes of the electro-optic crystal that can obtain the maximum electro-optic effect.

12. The electro-optic probe according to claim 6,
   wherein the unique polarization direction of the optical fiber is a slow axis or a fast axis of the optical fiber.

13. The electro-optic probe according to claim 6,
   wherein the unique axis of the electro-optic crystal and the unique polarization direction of the optical fiber are perpendicular to the traveling direction of light from the optical fiber that enters the electro-optic crystal.

* * * * *